US007020722B2

(12) United States Patent
Sivier et al.

(10) Patent No.: US 7,020,722 B2
(45) Date of Patent: Mar. 28, 2006

(54) SYNCHRONIZATION OF DISTRIBUTED SIMULATION NODES BY KEEPING TIMESTEP SCHEDULERS IN LOCKSTEP

(75) Inventors: Steven A. Sivier, Fremont, CA (US); Carl B. Frankel, San Francisco, CA (US); Carl Cavanagh, Oakland, CA (US); James P. Freyensee, Los Altos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 724 days.

(21) Appl. No.: 10/008,643

(22) Filed: Nov. 9, 2001

(65) Prior Publication Data

US 2003/0093569 A1 May 15, 2003

(51) Int. Cl.
*G06F 15/16* (2006.01)
*G06F 17/50* (2006.01)
*H03K 7/02* (2006.01)

(52) U.S. Cl. .................................... 709/248; 709/248
(58) Field of Classification Search ................ 709/201, 709/248; 375/353–356; 714/12; 713/375, 713/400; 370/241; 703/13–22
See application file for complete search history.

(56) References Cited

U.S. PATENT DOCUMENTS

| | | | |
|---|---|---|---|
| 4,456,994 A | 6/1984 | Segarra | |
| 4,821,173 A | 4/1989 | Young et al. | |
| 4,937,173 A | 6/1990 | Kanda et al. | |
| 5,185,865 A | 2/1993 | Pugh | |
| 5,327,361 A | 7/1994 | Long et al. | |
| 5,339,435 A | 8/1994 | Lubkin et al. | |
| 5,398,317 A * | 3/1995 | Nugent | 709/248 |
| 5,442,772 A | 8/1995 | Childs et al. | |
| 5,455,928 A | 10/1995 | Herlitz | |
| 5,519,848 A | 5/1996 | Wloka et al. | |
| 5,625,580 A | 4/1997 | Read et al. | |
| 5,634,010 A | 5/1997 | Ciscon et al. | |
| 5,715,184 A | 2/1998 | Tyler et al. | |
| 5,732,247 A | 3/1998 | Dearth et al. | |
| 5,751,941 A | 5/1998 | Hinds et al. | |
| 5,794,005 A | 8/1998 | Steinman | |

(Continued)

OTHER PUBLICATIONS

"Rule Base Driven Conversion of an Object Oriented Design Structure Into Standard Hardware Description Languages," Verschueren, A.C., IEEE Xplore, appears in Euromicro Conference, 1998, Proceedings. 24th, vol. 1, Aug. 25, 1998, pp. 42-45.

(Continued)

*Primary Examiner*—Krisna Lim
(74) *Attorney, Agent, or Firm*—Lawrence J. Merkel; Meyertons, Hood, Kivlin, Kowert & Goetzel, P.C.

(57) ABSTRACT

A distributed simulation system includes a plurality of nodes. Each node is configured to simulate a portion of a system under test. The simulation is performed as a series of timesteps. The transition between timesteps is synchronized in the plurality of nodes. In one implementation, the distributed simulation system includes a hub which is configured to synchronize the transition between timesteps in the plurality of nodes. For example, in one embodiment, the hub may receive commands from each of the plurality of nodes. If each command indicates that the corresponding node is capable of completing the timestep, the hub transmits a command to each node indicating that the timestep is complete. The nodes may begin processing the next timestep in response to the command. In other embodiments, a hub may not be included.

21 Claims, 13 Drawing Sheets

U.S. PATENT DOCUMENTS

| | | | |
|---|---|---|---|
| 5,812,824 A | | 9/1998 | Dearth et al. |
| 5,848,236 A | | 12/1998 | Dearth et al. |
| 5,850,345 A | | 12/1998 | Son |
| 5,870,585 A | | 2/1999 | Stapleton |
| 5,875,179 A | * | 2/1999 | Tikalsky ..................... 370/315 |
| 5,881,267 A | | 3/1999 | Dearth et al. |
| 5,892,957 A | * | 4/1999 | Normoyle et al. .......... 710/263 |
| 5,907,685 A | * | 5/1999 | Douceur ..................... 709/248 |
| 5,907,695 A | | 5/1999 | Dearth |
| 5,910,903 A | | 6/1999 | Feinberg et al. |
| 5,991,533 A | | 11/1999 | Sano et al. |
| 6,031,987 A | | 2/2000 | Damani et al. |
| 6,053,947 A | | 4/2000 | Parson |
| 6,117,181 A | | 9/2000 | Dearth et al. |
| 6,134,234 A | * | 10/2000 | Kapanen ..................... 370/350 |
| 6,345,242 B1 | | 2/2002 | Dearth et al. |
| 6,507,809 B1 | * | 1/2003 | Yoshino et al. |
| 6,711,411 B1 | * | 3/2004 | Ruffini ........................ 455/502 |
| 6,748,451 B1 | * | 6/2004 | Woods et al. ............... 709/248 |

OTHER PUBLICATIONS

"Modeling Communication with Objective VHDL," Putzke, et al., IEEE Xplore, appears in Verilog HDL Conference and VHDL International Use Forum, 1998, IVC/VIUF, Proceedings., 1998 International, Mar. 16, 1998, pp. 83-89.

"A Procedural Language Interface for VHDL and its Typical Applications," Martinolle, et al., IEEE Xplore, appears in Verilog HDL Conference and VHDL International Use Forum, 1998, IVC/VIUF, Proceedings., 1998 International, Mar. 16, 1998, pp. 32-38.

"The Verilog Procedural Interface for the Verilog Hardware Description Language," Dawson, et al., IEEE Xplore, appears in Verilog HDL Conference, 1996, Proceedings., 1996 International, Feb. 26, 1996, pp. 17-23.

"An Integrated Environment for HDL Verification," York, et al., IEEE Xplore, appears in Verilog HDL Conference, 1995, Proceedings., 1995 International, Mar. 27, 1995, pp. 9-18.

"The PowerPC 603 C++ Verilog Interface Model," Voith, R.P., IEEE Xplore, appears in Compcon Spring '94, Digest of Papters, Feb. 28, 1994, pp. 337-340.

Networked Object Oriented Verification with C++ and Verilog, Dearth, et al., IEEE, XP-002144328, 1998, 4 pages.

Patent Abstracts of Japan, publication No. 10326835, published Dec. 8, 1998.

Patent Abstracts of Japan, publication No. 10049560, published Feb. 20, 1998.

Patent Abstracts of Japan, publication No. 10340283, published Dec. 22, 1998.

Patent Abstracts of Japan, publication No. 07254008, published Oct. 3, 1995.

"Multiprocessing Verilog Simulator Exploits the Parallel Nature of HDLs." Lisa Maliniak, Electronic Design, Abstract, May 30, 1994, 1 page.

"It's A Multithreaded World, Part I," Charles J. Northrup, BYTE, May 1992, 7 pages.

"It's a Multithreaded World, Part 2," Charles J. Northrup, BYTE, Jun. 1992, pp. 351-356.

"Weaving a Thread," Shashi Prasad, BYTE, Oct. 1995, pp. 173-174.

"Making Sense of Collaborative Computing," Mark Gibbs, Network World Collaboration, Jan. 10, 1994, 4 pages.

"Parallel Logic Simulation of VLSI Systems," Bailey, et al., ACM Computing Surveys, vol. 26, No. 3, Sep. 1994, pp. 255-294.

"Multithreaded Languages for Scientific and Technical Computing," Cherri M. Pancake, Proceedings of the IEEE, vol. 81, No. 2, Feb. 1993, pp. 288-304.

"Distributed Simulation Architecture, SW Environment, Enterprise Server Products," Purdue EE400 Presentation by Freyensee and Frankel, Nov. 9, 2000, 13 pages.

"BNF and EBNF: What Are They And How Do They Work?," Lars Marius Garshol, Oct. 12, 1999, pp. 1-10.

"VCK: Verilog-C Kernel," Testbench Automation, Distributed by Verilog Simulation, Hardware-Software Co-verification, 2001 Avery Design Systems, Inc., 8 pages.

"Principles of Verilog PLI," Swapnajit Mittra, Silicon Graphics Incorporated, 1999, 10 pages.

"IEEE Standard Hardware Description language Based on the Verilog® Hardware Description Language," IEEE, Dec. 12, 1995, 8 pages.

"OpenVera 1.0, Language Reference Manual," Version 1.0, Mar. 2001, pp. 4-1 to 4-34, pp. 5-1 to 5-32, 6-1 to 6-22, 7-1 to 7-24, 11-1 to 11-50, 12-1 to 12-8, 13-1 to 13-14, 14-1 to 14-20, 15-1 to 15-118.

"VLSI Designe of a Bust Arbitration Module for the 68000 Series of Microprocessors," Ososanya, et al., IEEE, 1994, pp. 398-402.

"A VHDL Standard Package for Logic Modeling," David R. Coelho, IEEE Design & Test of Computers, vol. 7, Issue 3, Jun. 1990, pp. 25-32.

"Corrected Settling Time of the Distributed Parallel Arbiter," M.M. Taub, PhD., IEEE Proceedings, Part E: Computers and Digitals, vol. 139, Issue 4, Jul. 1992, pp. 348-354.

Jerry Banks, "Handbook of Simulation," 1998, John Wiley & Sons, Inc., pp. 3-51.

Robert W. Sebesta, "Concepts of Programming Languages," 1999, Addison Wesley Longman, Inc., Fourth Edition, pp. 105-131.

* cited by examiner

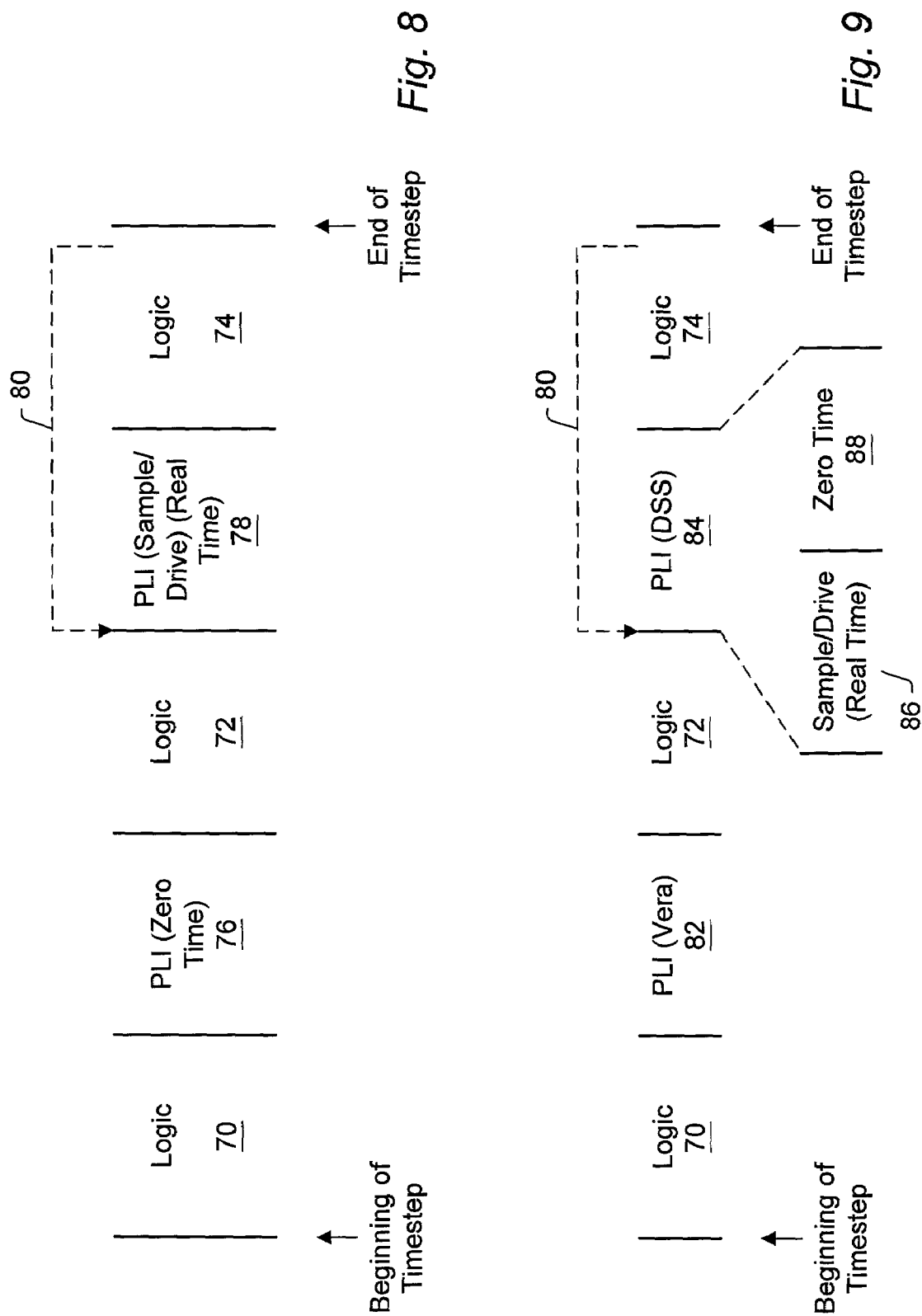

SYNCHRONIZATION OF DISTRIBUTED SIMULATION NODES BY KEEPING TIMESTEP SCHEDULERS IN LOCKSTEP

BACKGROUND OF THE INVENTION

1. Field of the Invention

This invention is related to the field of distributed simulation systems.

2. Description of the Related Art

Generally, the development of components for an electronic system such as a computer system includes simulation of models of the components. In the simulation, the specified functions of each component may be tested and, when incorrect operation (a bug) is detected, the model of the component may be changed to generate correct operation. Once simulation testing is complete, the model may be fabricated to produce the corresponding component. Since many of the bugs may have been detected in simulation, the component may be more likely to operate as specified and the number of revisions to hardware may be reduced. The models are frequently described in a hardware description language (HDL) such as Verilog, VHDL, etc. The HDL model may be simulated in a simulator designed for the HDL, and may also be synthesized, in some cases, to produce a netlist and ultimately a mask set for fabricating an integrated circuit.

Originally, simulations of electronic systems were performed on a single computing system. However, as the electronic systems (and the components forming systems) have grown larger and more complex, single-system simulation has become less desirable. The speed of the simulation (in cycles of the electronic system per second) may be reduced due to the larger number of gates in the model which require evaluation. Additionally, the speed may be reduced as the size of the electronic system model and the computer code to perform the simulation may exceed the memory capacity of the single system. As the speed of the simulation decreases, simulation throughput is reduced.

To address some of these issues, distributed simulation has become more common. Generally, a distributed simulation system includes two or more computer systems simulating portions of the electronic system in parallel. Each computer system must communicate with other computer systems simulating portions of the electronic system to which the portion being simulated on that computer system communicates, to pass signal values of the signals which communicate between the portions. Generally, distributed simulation systems sample output signals from the model in each node and communicate the corresponding signal values to other nodes. The received signal values are then driven as inputs to the models in those other nodes.

Since signal values are communicated between the nodes, some sort of synchronization of the simulations executing on each node is used. Typically, one of two forms of synchronization is performed: distributing a master clock to all of the simulations, or including a local copy of a common clock generator. In either case, the simulations may be synchronized using the clock signal. In other words, the simulations may generally proceed freely (without communication with other simulations in other nodes) until the end of the current clock cycle of the clock signal is reached. The simulation then waits for the clock signal to change state to start the next clock cycle.

SUMMARY OF THE INVENTION

A distributed simulation system includes a plurality of nodes. Each node is configured to simulate a portion of a system under test. The simulation is performed as a series of timesteps. The transition between timesteps is synchronized in the plurality of nodes. In one implementation, the distributed simulation system includes a hub which is configured to synchronize the transition between timesteps in the plurality of nodes. For example, in one embodiment, the hub may receive commands from each of the plurality of nodes. If each command indicates that the corresponding node is capable of completing the timestep, the hub transmits a command to each node indicating that the timestep is complete. The nodes may begin processing the next timestep in response to the command. In other embodiments, a hub may not be included. Each node may be configured to communicate with other nodes, and the nodes may locally determine when the timestep is completed in each node (and may begin processing the next timestep in response to determining that the timestep is complete, thus synchronizing the transition to the next timestep).

BRIEF DESCRIPTION OF THE DRAWINGS

The following detailed description makes reference to the accompanying drawings, which are now briefly described.

FIG. 8 is a timing diagram illustrating operation of a second embodiment of a DSN during a simulation timestep.

FIG. 9 is a timing diagram illustrating operation of a third embodiment of a DSN during a simulation timestep.

Figure 1:
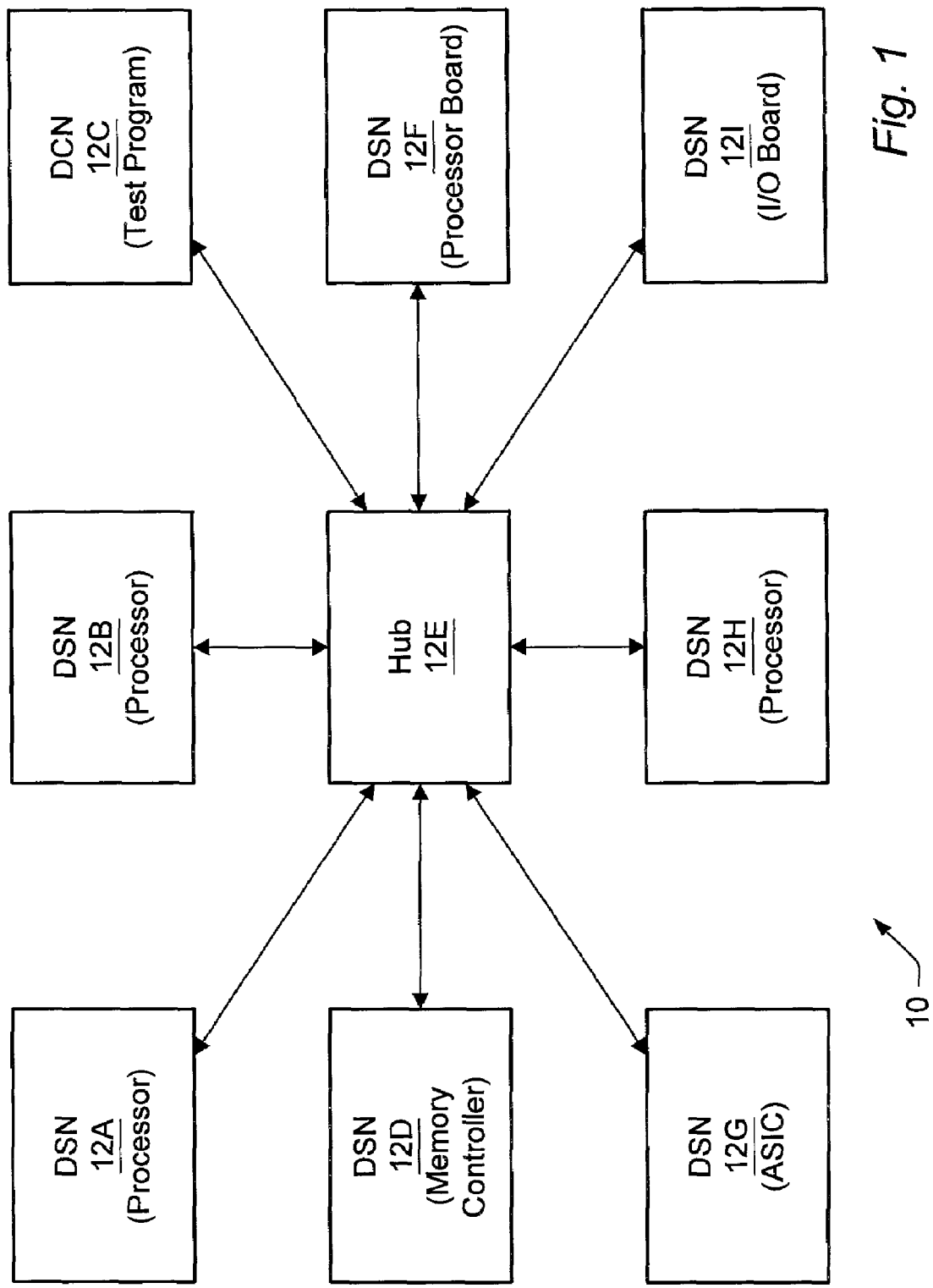
FIG. 1 is a block diagram of one embodiment of a distributed simulation system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

Distributed Simulation System Overview

In the discussion below, both the computer systems comprising the distributed simulation system (that is, the computer systems on which the simulation is being executed) and the electronic system being simulated are referred to. Generally, the electronic system being simulated will be referred to as the "system under test".

Turning now to FIG. 1, a block diagram of one embodiment of a distributed simulation system 10 is shown. Other embodiments are possible and contemplated. In the embodiment of FIG. 1, the system 10 includes a plurality of nodes 12A–12I. Each node 12A–12D and 12F–12I is coupled to communicate with at least node 12E (which is the hub of the distributed simulation system). Nodes 12A–12B, 12D, and 12F–12I are distributed simulation nodes (DSNs), while node 12C is a distributed control node (DCN).

Generally, a node is the hardware and software resources for: (i) simulating a component of the system under test; or (ii) running a test program or other code (e.g. the hub) for controlling or monitoring the simulation. A node may include one or more of: a computer system (e.g. a server or a desktop computer system), one or more processors within a computer system (and some amount of system memory allocated to the one or more processors) where other processors within the computer system may be used as another node or for some other purpose, etc. The interconnection between the nodes illustrated in FIG. 1 may therefore be a logical interconnection. For example, in one implementation, Unix sockets are created between the nodes for communication. Other embodiments may use other logical interconnection (e.g. remote procedure calls, defined application programming interfaces (APIs), shared memory, pipes, etc.). The physical interconnection between the nodes may vary. For example, the computer systems including the nodes may be networked using any network topology. Nodes operating on the same computer system may physically be interconnected according to the design of that computer system.

A DSN is a node which is simulating a component of the system under test. A component may be any portion of the system under test. For example, the embodiment illustrated in FIG. 1 may be simulating a computer system, and thus the DSNs may be simulating processors (e.g. nodes 12A–12B and 12H), a processor board on which one or more of the processors may physically be mounted in the system under test (e.g. node 12F), an input/output (I/O) board comprising input/output devices (e.g. node 12I), an application specific integrated circuit (ASIC) which may be mounted on a processor board, a main board of the system under test, the I/O board, etc. (e.g. node 12G), or a memory controller which may also be mounted on a processor board, a main board of the system under test, the I/O board, etc. (e.g. node 12D).

Depending on the configuration of the system under test, various DSNs may communicate. For example, if the processor being simulated on DSN 12A is mounted on the processor board being simulated on DSN 12F in the system under test, then input/output signals of the processor may be connected to output/input signals of the board. If the processor drives a signal on the board, then a communication between DSN 12A and DSN 12F may be used to provide the signal value being driven (and optionally a strength of the signal, in some embodiments). Additionally, if the processor being simulated on DSN 12A communicates with the memory controller being simulated on DSN 12D, then DSNs 12A and 12D may communicate signal values/strengths.

A DCN is a node which is executing a test program or other code which is not part of the system under test, but instead is used to control the simulation, introduce some test value or values into the system under test (e.g. injecting an error on a signal), monitor the simulation for certain expected results or to log the simulation results, etc.

A DCN may communicate with a DSN to provide a test value, to request a value of a signal or other hardware modeled in the component simulated in the DSN, to communicate commands to the simulator in the DSN to control the simulation, etc.

The hub (e.g. node 12E in FIG. 1) is provided for routing communications between the various other nodes in the distributed simulation system. Each DSN or DCN transmits commands to the hub, which parses the commands and forwards commands to the destination node or nodes for the command. Additionally, the hub may be the destination for some commands (e.g. for synchronizing the simulation across the multiple DSNs and DCNs).

The format and interpretation of the commands may be specified by a grammar implemented by the nodes 12A–12I. The grammar is a language comprising predefined commands for communicating between nodes, providing for command/control messages for the simulation as well as commands transmitting signal values (and optionally signal strength information). Commands transmitting signal values are referred to as transmit commands herein. In addition to the transmit commands, the grammar may include a variety of other commands. For example, commands to control the start, stop, and progress of the simulation may be included in the grammar. Furthermore, a user command may be included which allows for an arbitrary string (e.g. code to be executed, or a message to code executing in a node) to be passed between nodes.

While the embodiment shown in FIG. 1 includes a node operating as a hub (node 12E), other embodiments may not employ a hub. For example, DSNs and DCNs may each be coupled to the others to directly send commands to each other. Alternatively, a daisy chain or ring connection between nodes may be used (where a command from one node to another may pass through the nodes coupled therebetween). In some embodiments including a hub, the hub may comprise multiple nodes. Each hub node may be coupled to one or more DSN/DCNs and one or more other hub nodes (e.g. in a star configuration among the hub nodes). In some embodiments, a DCN or DSN may comprise multiple nodes.

Timestep Synchronization

Each of the DSNs simulates the model of the portion of the system under test assigned to that DSN. The DSN simulates the model as a series of timesteps (e.g. in one embodiment the DSN includes a simulator configured to simulate the model as a series of timesteps). Generally, a timestep is the granule of simulation time by which the simulator evaluates events and advances. Simulation time is time measured in the simulation, as opposed to the actual time elapsing to calculate the simulation state during that simulation time. For event based simulators, such as simulators compliant with the IEEE 1364-1995 Verilog specification, the timestep may be any period of simulation time.

In one embodiment, the timestep may be selected to be a time interval which is less than or equal to a time interval corresponding to the lowest common multiple of the frequencies of clocks in the system under test multiplied by two (in accordance with Nyquist digital sampling theorem). The processing of all events which occur within a first timestep results in the end of the first timestep. As used herein, the phrase "evaluating the model" or "evaluating the logic" may refer to processing, by the simulator, of each of the then-scheduled events which occur in the current timestep.

Generally, events may include update events and evaluation events. An update event is a change in a signal value or register value. An evaluation event is the evaluation of a process (e.g. a circuit or other Verilog construct having the signal value as an input) which is sensitive to the update event. Events are scheduled either for the current simulation time (a simulation time within the current timestep) or a future simulation time (a time beyond the current simulation time by more than a timestep). The simulation time from a causal event to the resulting event is the approximate amount of actual time elapsing from the causal event to the corresponding circuitry generating the resulting event.

The length of each timestep (i.e. the amount of simulation time that elapses during the timestep) may be equal in each DSN. The length of the timestep may be set in a variety of ways (e.g. as an option to the simulator on the command line or in a file, as part of the model, etc.). In one embodiment, a tick timescale (' timescale) directive in Verilog is used to set the length of the timestep. Each Verilog model in the distributed simulation system may have the same tick timescale directive.

The distributed simulation system 10 may synchronize the simulation on a timestep basis. That is, each DSN in the system may complete a given timestep before any of the DSNs begin simulating the next timestep. By ensuring that all DSNs are capable of transition to the next timestep, communication between the nodes within the timestep may be completed before any nodes begin simulation of the next timestep. The granularity of communication between nodes may thus be the timestep.

In one embodiment, each DSN may transmit a first command indicating that the DSN is capable of completing the timestep to the hub. The first command will be referred to herein as the "local timestep complete" command. A DSN may be capable of completing a timestep if it has evaluated all events within the timestep and has no communications to perform with other nodes (e.g. no output signal values to transmit). Viewed in another way, the DSN may indicate a readiness to complete the current timestep by transmitting the local timestep complete command.

The hub may synchronize the transition to the next timestep in the DSNs. For example, the hub may wait for each DSN to send the local timestep complete command, and then may transmit a second command to each DSN indicating that the DSN may proceed to the next timestep. The second command will be referred to herein as the "global timestep complete" command.

The DSN may receive a command (e.g. a transmit command with signal values for input signals to the model in that DSN) which may cause the DSN to schedule and evaluate additional events within the timestep after transmitting the local timestep complete command. In other words, the DSN may lose the readiness to complete the current time step by receiving the command. In such a case, the DSN may transmit the local timestep complete command again after evaluating any new events (and transmitting any output signal values that may change as a result). Thus, the hub may wait until the most recent communication from each DSN is the local timestep complete command (and no more commands have been transmitted to the DSN subsequent to the local timestep complete command being received) to determine that all DSNs have completed the current timestep and thus to allow the transition to the next timestep. In one embodiment described in more detail below, the hub uses a synchronous communication mechanism in which a command is received from each DSN/DCN and then the hub transmits a command to each DSN/DCN. If one or more of the received commands is not the local timestep complete command, the hub does not transmit the global timestep complete command. The hub then returns to wait for a command from each DSN/DCN. The above cycle repeats until each received command is the local timestep complete command, at which point the hub transmits the global timestep complete command (allowing transition to the next timestep).

As used herein, a transition from a first timestep to a second timestep is "synchronized" if each of the DSNs are permitted to complete the processing in the first timestep prior to any of the DSNs being permitted to begin processing in the second timestep. The DSNs may not all begin processing in the second timestep at the same time (e.g. delays in transmitting the command from the hub indicating that the next timestep may proceed may be different for different DSNs).

It is noted that, while the above discussion referred to a hub performing the synchronization, other embodiments may not include a hub. Instead, each node may be configured to detect the synchronization by examining the commands received from other nodes (e.g. in a manner similar to the hub). In a daisy chain or ring configuration, a token or other message may be used to communicate the synchronization status.

Figure 2:
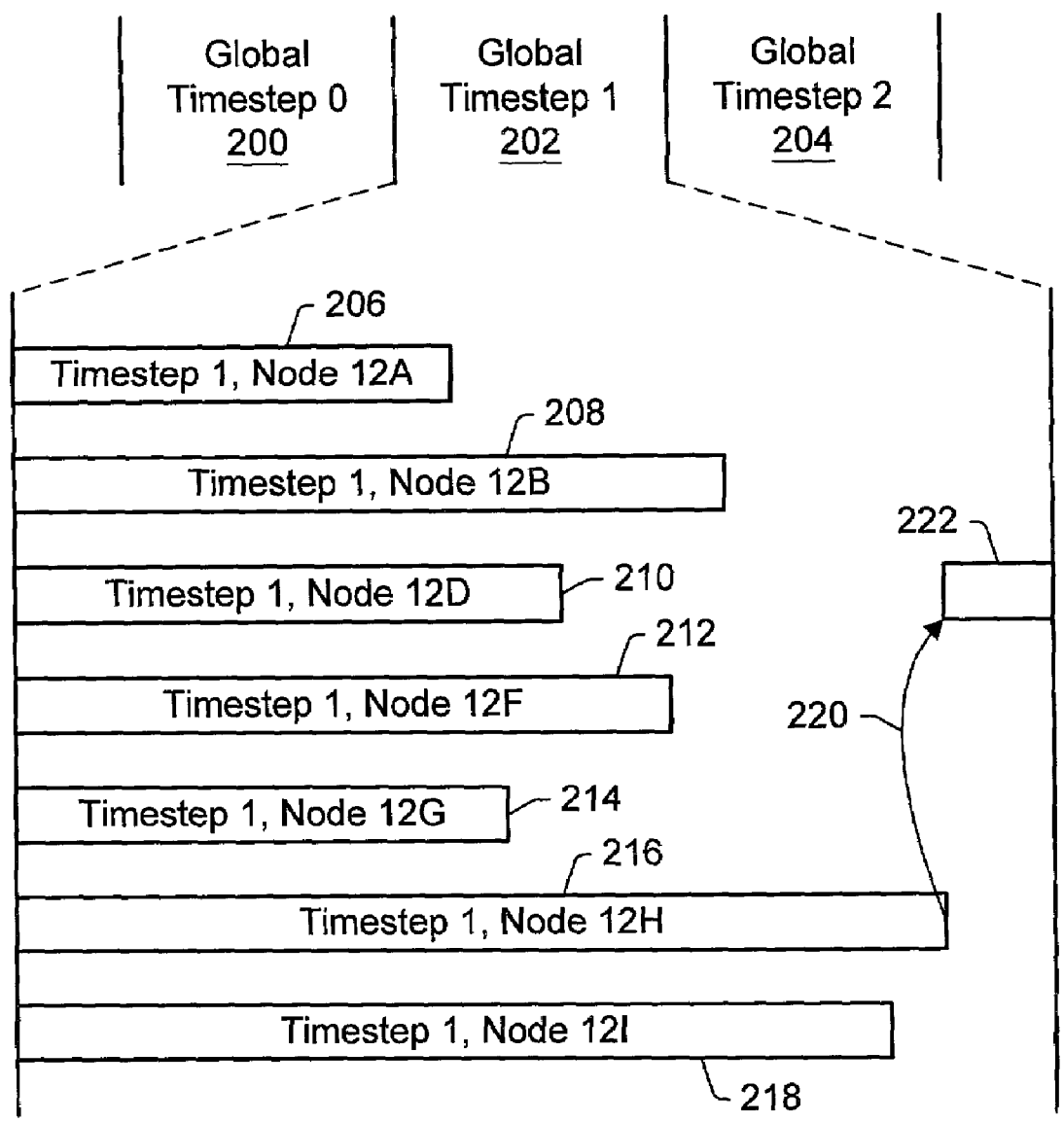
FIG. 2 is a timing diagram illustrating one embodiment of several global timesteps and the composition of one of the global timesteps.

FIG. 2 is a timing diagram illustrating the synchronization of timesteps in the distributed simulation system 10 shown in FIG. 1. FIG. 2 illustrates three consecutive global timesteps labeled global timestep 0, 1, and 2 (reference numerals 200, 202, and 204 respectively). The global timestep 1 (202) is illustrated in exploded view and includes the local timestep 1 in each of nodes 12A, 12B, 12D, 12F, 12G, 12H, and 12I (reference numerals 206, 208 210, 212, 214, 216, and 218 respectively). Other global timesteps (e.g. reference numerals 200 and 204) may be similar (although the local timesteps in each node may occupy differing amounts of actual time relative to each other).

Within the exploded view, the amount of actual time used in each node to process the local timestep is illustrated. The length of the boxes enclosing each local timestep (reference numerals 206–218) may represent the actual time used by the simulators in each node to process the local timestep 1. For example, node 12B takes longer to evaluate local timestep 1 (reference numeral 208) than node 12A takes to evaluate local timestep 1 (reference numeral 206). The amount of time each node takes to process the local timestep may depend on a variety of factors. For example, the complexity of the model being simulated in a node may affect the amount of time to evaluate the model for a local timestep. Viewed in another way, the number of events to be evaluated in a given local timestep may affect the amount of time to evaluate the model for the local timestep. Additionally, the amount of computing power in the node may affect the amount of time (e.g. a node with more computing power may evaluate a given model more rapidly than a node with less computing power may evaluate the given model).

Even though some nodes may process their local timestep 1 more rapidly than others, those nodes do not progress to timestep 2 until each node has completed processing in timestep 1. This synchronization allows communication among the nodes during the timestep. For example, the arrow 220 illustrates a communication from node 12H to node 12D (which finished processing local timestep 1 earlier in time than node 12H in this example). Since the timestep transitions are synchronized, the communication may be observed in node 12D during local timestep 1, even though node 12D otherwise finished processing local timestep 1 earlier in time than did node 12H.

The communication may be a transmit command including signal values which are inputs to the model in node 12D, or may be a high level communication which causes an event. The communication from node 12H causes one or more events to be scheduled within local timestep 1 in node 12D. Accordingly, node 12D reevaluates the model therein for the newly scheduled events (and any events caused by the newly scheduled events, if such events occur in timestep 1) (reference numeral 222). The newly scheduled events may also result in scheduling additional events for a future timestep, such as timestep 2.

While only one communication is illustrated in FIG. 2, generally any number of communications may occur between nodes prior to the transition to the next timestep. Such communications may cause the receiving DSN to reevaluate the model therein (if one or more events are caused), or may cause the receiving DSN to transmit a response to the communication. Furthermore, a communication from one DSN to another may itself result in the receiving DSN transmitting a communication to yet another DSN. The global timestep 1 (202) may not terminate until the communication between DSNs is completed and each DSN has indicated that it is ready to transition to the next timestep.

It is noted that, while only the DSNs are illustrated as participating in timestep synchronization in FIG. 2, DCNs may also participate in timestep synchronization. While the DCNs may not necessarily include a simulator, the DCN may mimic completing a timestep to track which timestep the simulation is in.

It is noted that, while the local timesteps (reference numerals 206–218) are illustrated starting at the same time in FIG. 2, generally the nodes may begin processing the local timestep at disjoint times. However, no local timestep processing may occur prior to the beginning of the global timestep 202 (which is subsequent to the completion of processing of all local timesteps in global timestep 200). It is further noted that the global timesteps illustrated in FIG. 2 are used for illustration purposes but may be conceptual only. That is, no simulator may be operating according to the global timestep. The hub controls transitions between the local timesteps in each of the DSNs (or the DSNs detect the transitions individually, if a hub is not used), thus creating the effect of the global timestep.

Figure 3:
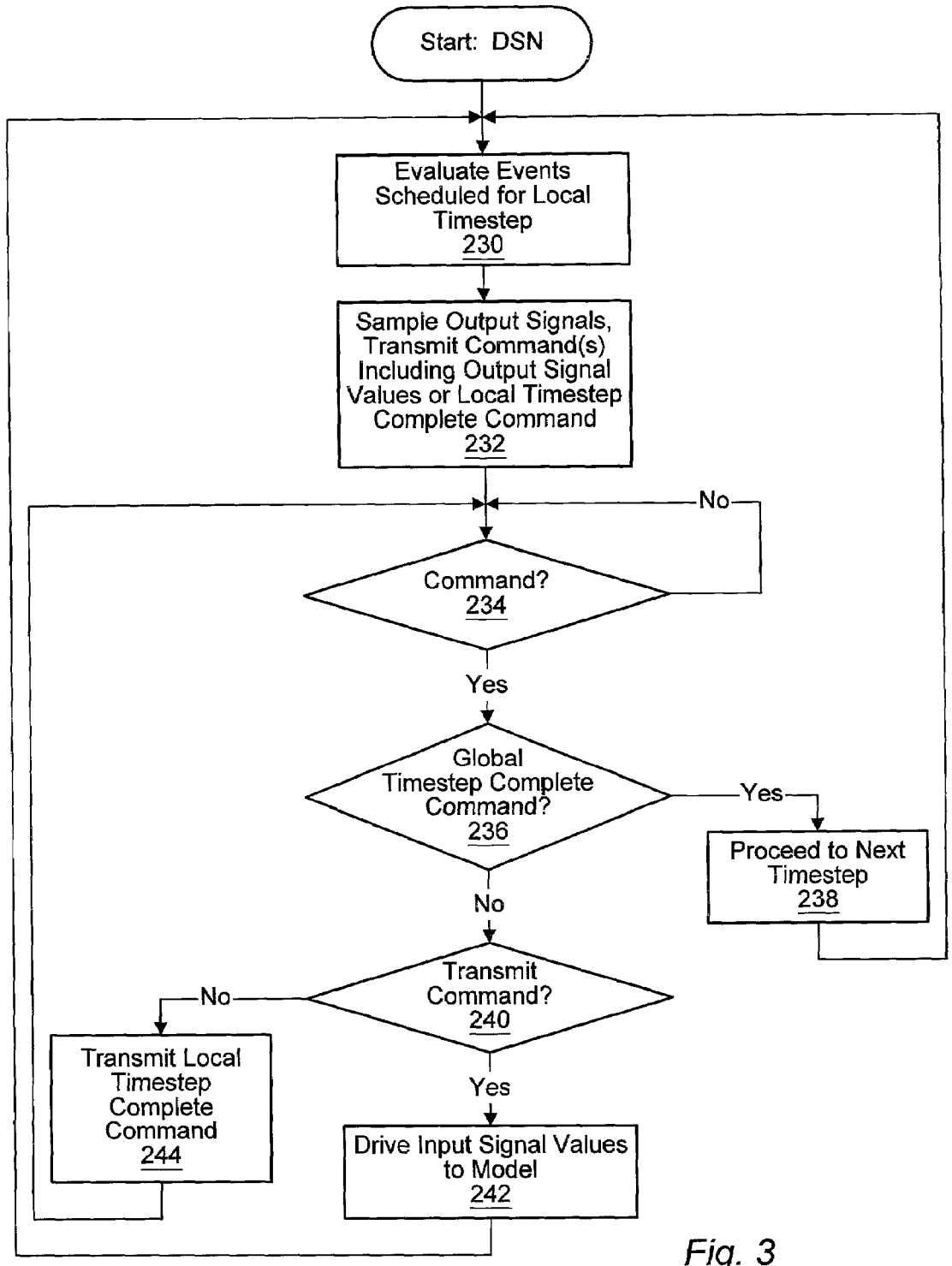
FIG. 3 is a flowchart illustrating operation of one embodiment of a distributed simulation node (DSN) according to one embodiment of synchronizing the local timesteps.

Turning now to FIG. 3, a flowchart is shown illustrating operation of one embodiment of a DSN. Other embodiments are possible and contemplated. While the blocks are shown in FIG. 3 in a particular order for ease of understanding, other orders may be used. Furthermore, blocks may be performed in parallel. The blocks shown in FIG. 3 may represent instruction code which, when executed, performs the blocks shown in FIG. 3.

At the beginning of the local timestep, the DSN evaluates the events scheduled for that timestep (block 230). The evaluation of events may include previously scheduled events as well as events scheduled within the timestep due to evaluation of events within the timestep. Once the DSN has evaluated all local events, the DSN samples the output signals for the model in that DSN and transmits one or more transmit commands including the output signal values to the hub (block 232). In one embodiment, the DSN may transmit only those signal values that have changed during the current timestep. If there are no changes to the output signal values, the DSN may transmit the local timestep complete command.

The DSN waits to receive a command (decision block 234). The waiting may be accomplished in a variety of fashions. For example, the decision block 234 may represent polling for a command, or may represent the DSN being inactive ("asleep") until the command is received.

If the received command is the global timestep complete command (decision block 236), the DSN may advance to the next timestep (block 238) and return to block 230 to evaluate events in the new timestep.

If the received command is a transmit command (decision block 240), the DSN may drive signal values from the transmit command on input signals to the model (block 242) and then may return to block 230 to evaluate any new events that may occur due to the signal changes. If any output signal changes occur (e.g. asynchronous signals or bi-directional signals), the output signal changes may be transmitted in block 232 (or a local timestep complete command if no output signal changes).

If the received command is not the global timestep complete command nor the transmit command, the DSN may process the command and may transmit the local timestep complete command (block 244). In one embodiment, the received command is a no-operation command specifying that the DSN take no action in response to the command. Alternatively, the command may be a high level communication from another node. In such a case, if the command requires a response, the DSN may respond to the command instead of transmitting the local timestep complete command.

Figure 4:
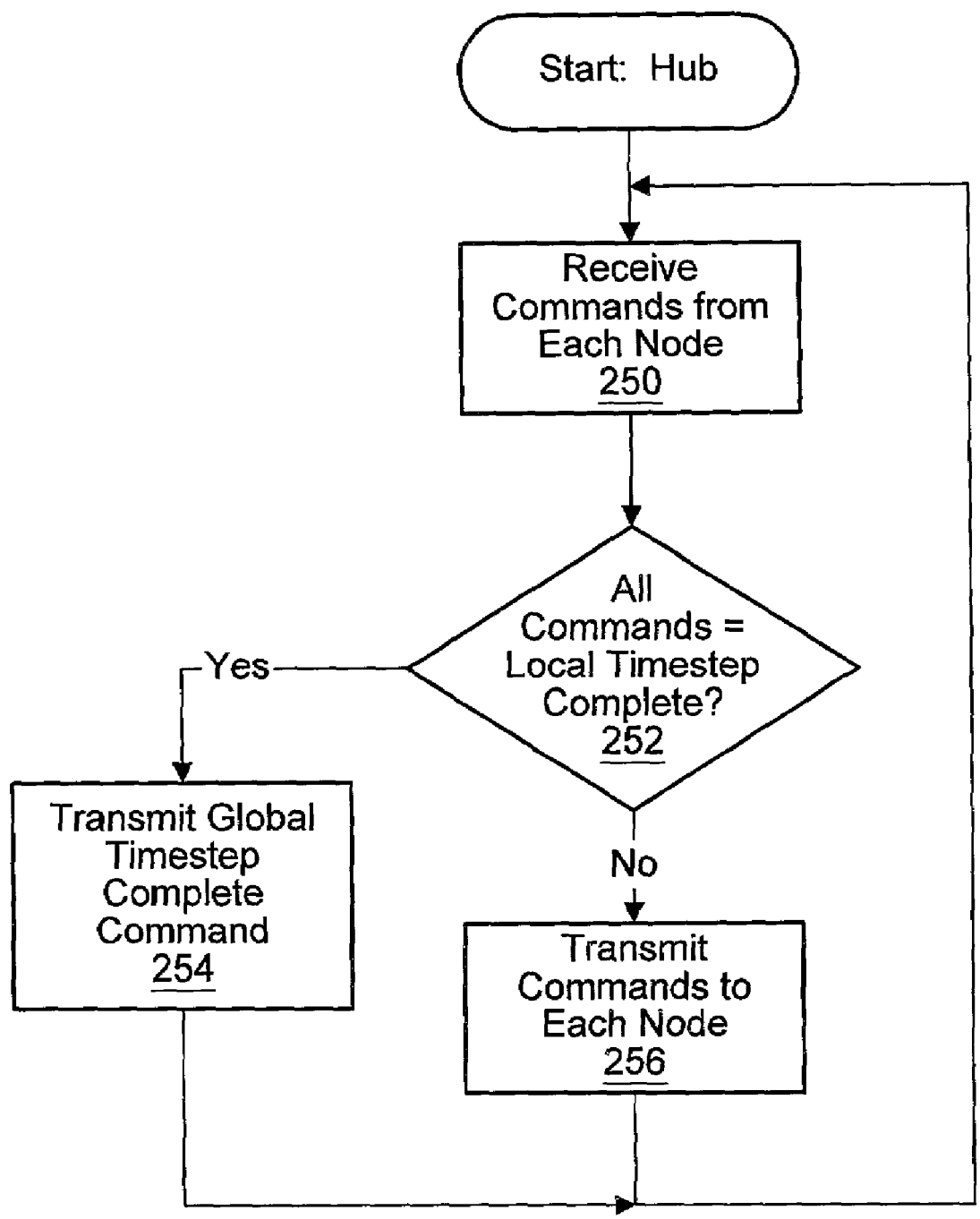
FIG. 4 is a flowchart illustrating operation of one embodiment of a hub according to one embodiment of synchronizing the local timesteps.

Turning next to FIG. 4, a flowchart is shown illustrating operation of one embodiment of the hub. Other embodiments are possible and contemplated. While the blocks are shown in FIG. 4 in a particular order for ease of understanding, other orders may be used. Furthermore, blocks may be performed in parallel. The blocks shown in FIG. 4 may represent instruction code which, when executed, performs the blocks shown in FIG. 4.

The hub waits to receive a command from each node (block 250). The hub processes each received command, and may generate one or more commands for transmission to other nodes. For example, if a transmit command with signal values is received, the hub many generate transmit commands for each node which receives one or more of the signal values. High level commands may result in high level commands to be routed to the destination node.

Once a command has been received from each node, the hub checks to see if each received command is the local timestep complete command (decision block 252). If so, then the nodes have completed the local timesteps. Accordingly, the hub transmits the global timestep complete command to each of the nodes (block 254), synchronizing transition to the next timestep. The hub then returns to block 250 to synchronize transition from the next timestep to the following timestep.

If at least one node did not send the local timestep complete command, the hub sends a command to each node (block 256). The command may be a transmit command including signal values transmitted by one or more other nodes, gathered together by the hub if sent from two or more other nodes. The command may be another command routed from one node to another. If there are no commands to route to a given node, the hub may transmit the no-operation (NOP) command to the given node. The hub then returns to block 250 and waits for commands from each node.

Generally, the embodiment of the hub shown in FIG. 4 uses a synchronous method of determining when the timestep is complete. In the illustrated mechanism, the hub receives one command from each node prior to transmitting commands to each node. As illustrated in FIG. 3, a DSN sends either some type of command to be sent to another node, or a local timestep complete command if no other command is to be sent. Thus, if each received command is a local timestep complete command, the timestep is complete (indicated by sending a global timestep complete command from the hub to each node). Otherwise, the hub transmits at least one command to each node (either a command routed from another node or a NOP command) and the hub then waits for commands. Other embodiments may transmit any fixed number of commands per node, or may allow a variable number of commands per node to be transmitted. Still further, a fully asynchronous communication mechanism may be used (with nodes sending commands as desired, and the hub forwarding the commands as received, until each node indicates that it is finished sending commands (e.g. with a local timestep complete command), at which time the hub may transmit a global timestep complete command to each node to signify the end of the timestep).

Additional Details

Figure 5:
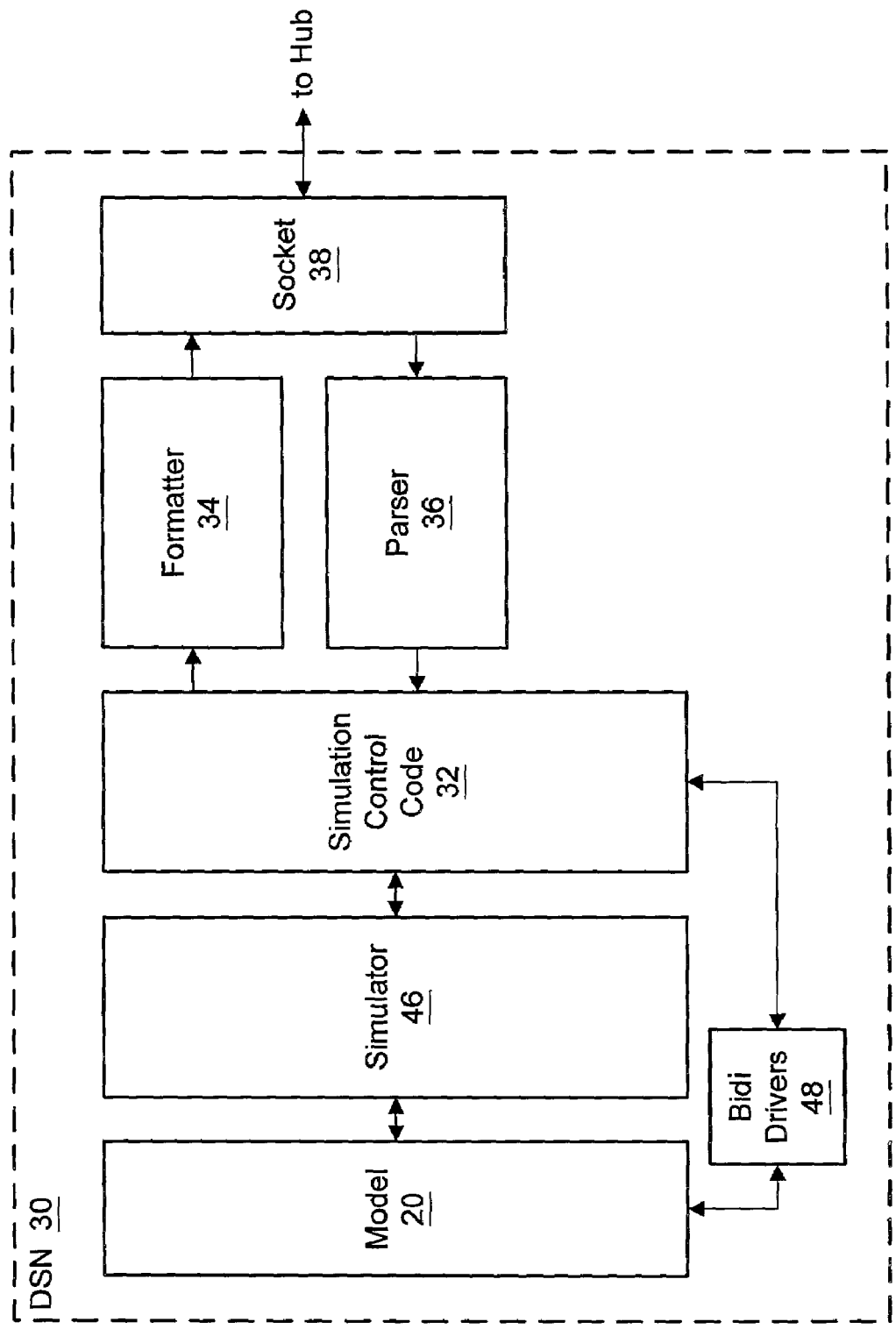
FIG. 5 is a block diagram of one embodiment of a DSN.
Figure 6:
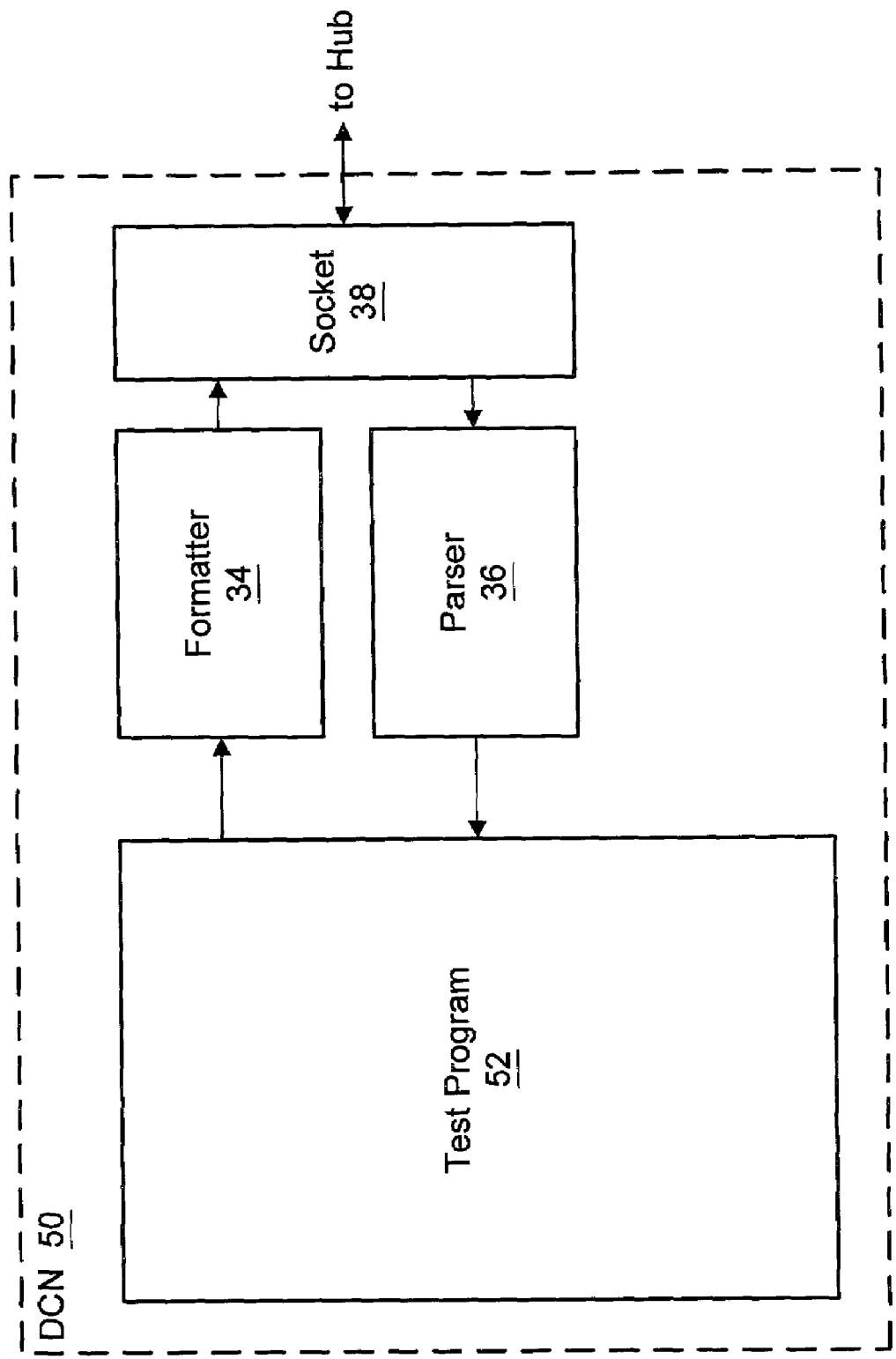
FIG. 6 is a block diagram of one embodiment of a distributed control node (DCN).
Figure 7:
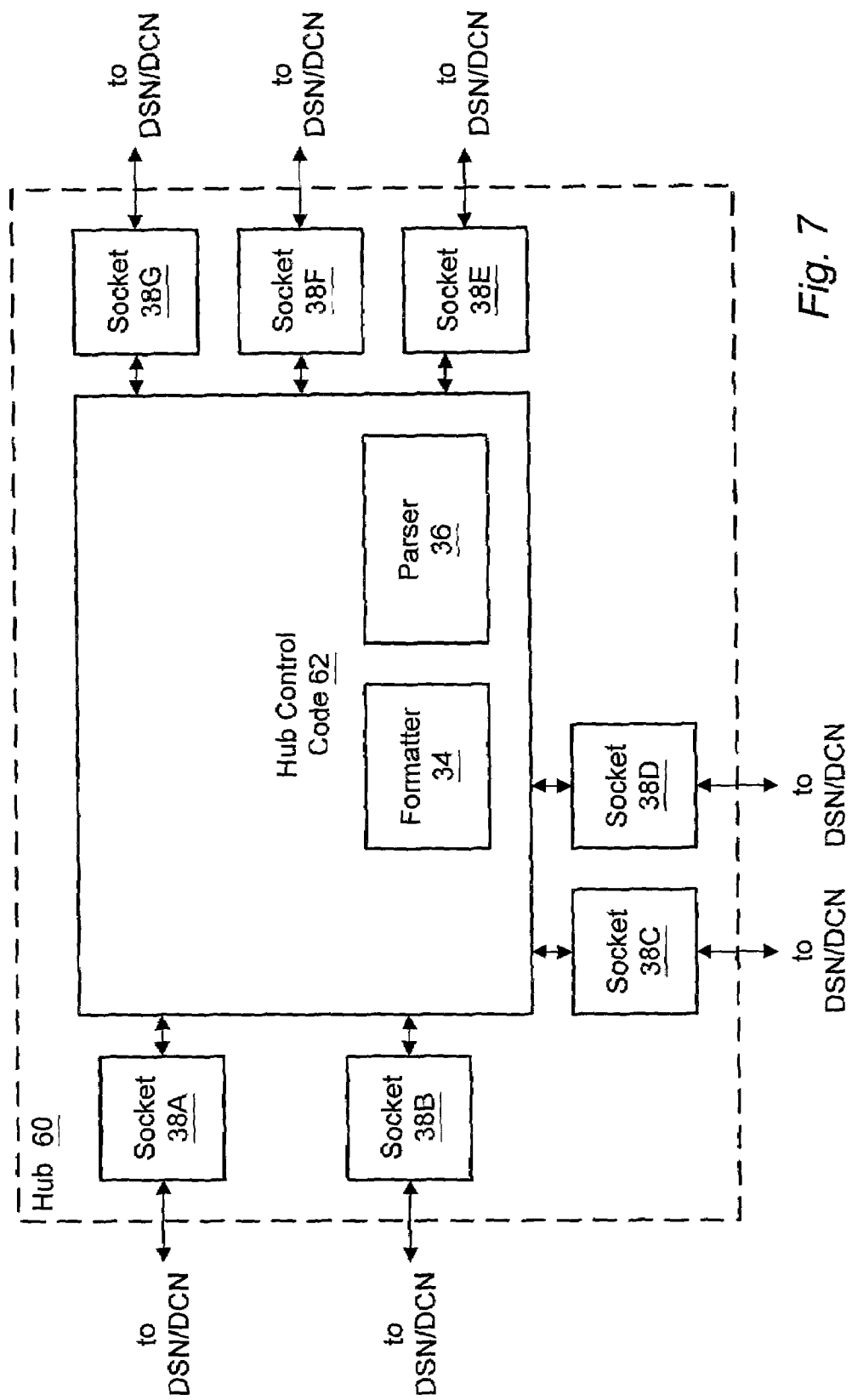
FIG. 7 is a block diagram of one embodiment of a hub.

FIGS. 5–7 illustrate additional details of one embodiment of a DSN, a DCN, and a hub. Other embodiments are possible and contemplated. The embodiment of FIGS. 5–7 is provided merely as an example of various programs that may be included in a DSN, a DCN, and a hub.

Turning now to FIG. 5, a block diagram of one embodiment of a DSN 30 is shown. The DSN 30 may be an example of the instruction code included in any of the nodes 12A–12B, 12D, or 12F–12I shown in FIG. 1. Other embodiments are possible and contemplated. In the embodiment of FIG. 5, the DSN 30 includes a model 20, a set of bi-directional drivers (bidi drivers) 48, a simulator 46, simulation control code 32, a formatter 34, a parser 36, and a socket 38. Each of the simulator 46, the simulation control code 32, the formatter 34, the parser 36, and the socket 38 comprise instruction sequences for performing various functions. While illustrated separately in FIG. 5, these instruction sequences may be combined, as desired. The illustration in FIG. 5 is a logical partitioning of the function which may not be maintained in the actual program code files, if desired. In one embodiment, the flowchart of FIG. 3 may be implemented as part of the simulation control code 32 and/or the simulator 46.

Generally, the model 20 may be a simulatable model of a component of a system under test. The model may be an HDL model (e.g. a Verilog model, a VHDL model, etc.). The model may be a register transfer level (RTL) model of the design of the component. Alternatively, the model may be a behavioral description of the operation of the component, again written in HDL. The model may be a behavioral or functional model written in a verification language such as Vera®. Vera® may be a hardware verification language. A hardware verification language may provide a higher level of abstraction than an HDL. The model may also be coded in other languages (e.g. high level programming languages such as C or C++). It is further contemplated that a "model" could also be the hardware component, instantiated with interface logic allowing signals to be sampled and driven in response to the simulation.

The bidi drivers 48 may be used if the model 20 includes one or more bi-directional signals. One RTL driver circuit may be included for each bi-directional signal. The simulation control code 32 may place a value to be driven on a bi-directional signal (based on transmit commands received from other nodes having models coupled to the same bi-directional signal) and enable the driver to supply the proper state on the bi-directional signal.

The simulator 46 may generally be any commercially available simulator for the model 20. For example, Verilog embodiments may employ the NCVerilog program manufactured by Cadence Design Systems, Inc. (San Jose, Calif.); the VCS program manufactured by Synopsys, Inc. (Mountain View, Calif.); the VerilogXL simulator from Cadence; or the SystemSim program from Co-Design Automation, Inc. of Los Altos, Calif., among others. In one embodiment, the simulator 46 is an event driven simulator, although other embodiments may employ any type of simulator including cycle based simulators.

The simulation control code 32 is configured to interface with the simulator 46, the bidi drivers 48, the formatter 34, and the parser 36. The simulation control code 32 may include custom simulation code written to interface to the simulator, such as Vera® or C++ code which may be called at designated times during a simulation timestep by the simulator. The custom simulation code may include code to react to various grammar commands which may be transmitted to the DSN 30 from the hub.

The formatter 34 receives communication requests from the simulation control code 32 and formats the requests according to the grammar for transmission to the hub. In other words, the formatter 34 generates commands defined in the grammar based on the communication requests. The parser 36 receives commands from the socket 38 and parses the commands according to the grammar.

The socket 38 may be a generic Unix socket implementation for communicating with the hub. While one socket 3 8 is shown with bi-directional communication with the hub, other embodiments may include two independent sockets, each communicating in one direction (sending or receiving) with the hub. Multiple unidirectional or bi-directional sockets may be used, as desired.

Turning now to FIG. 6, a block diagram of one embodiment of a DCN 50 is shown. The DCN 50 may be an example of the instruction code included in the node 12C shown in FIG. 1. Other embodiments are possible and contemplated. In the embodiment of FIG. 6, the DCN 50 includes a test program 52, the formatter 34, the parser 36, and the socket 38. Each of the test program 52, the formatter 34, the parser 36, and the socket 38 comprise instruction sequences for performing various functions. While illustrated separately in FIG. 6, these instruction sequences may be combined, as desired. The illustration in FIG. 6 is a logical partitioning of the function which may not be maintained in the actual program code files, if desired.

The test program 52 may be programmed for any desired test operation. For example, the test program 52 may be configured to inject errors or provide non-error values at a given point or points in the system under test at a given time or times during the simulation. The test program 52 may be configured to transmit the error or non-error value as a transmit command at the given time, formatted by the formatter 34. The test program 52 may be configured to monitor for certain events in the simulation (e.g. by receiving transmit commands from custom code in the desired DSN 30). In general, any desired test operation may be performed by the test program 52.

Turning now to FIG. 7, a block diagram of one embodiment of a hub 60 is shown. The hub 60 may be an example of the instruction code included in the node 12E shown in FIG. 1. Other embodiments are possible and contemplated. In the embodiment of FIG. 7, the hub 60 includes a hub control code 62 (which may include the formatter 34 and the parser 36), a set of sockets 38A–38G (the number of which may be equal to the number of DSNs and DCNs, or a multiple of the number if more than one socket is used per node). The sockets 38A–38G may each be similar to the socket 38 described above. In one embodiment, the hub control code 62 may implement the flowchart of FIG. 4.

The hub control code 62 may generally receive commands from the sockets 38A–38G. The hub control code 62 may process each command, which may result in generating commands for other nodes (or for the source node of the command). For example, transmit commands from a sending DSN may result in one or more transmit commands to other nodes which are connected to the signals. Other types of commands may be used by the hub itself (e.g. for synchronizing the DSNs during the simulation) or may be routed to other nodes (e.g. the user command described in more detail below). The hub control code 62 may use the parser 36 for parsing the received commands and may use the formatter 34 for formatting the commands to be transmitted, in a manner similar to the discussion above for DSNs and DCNs.

In one embodiment, the hub control code 62 may be multithreaded, with a separate thread for each socket. The thread may receive a command from the socket, and invoke the parser 36 to parse the command. The thread may also receive commands from the formatter 34 for transmission on the corresponding socket 38A–38G. The parser 36 and formatter 34 may be shared among the threads, or there may be separate copies of the parser 36 and the formatter 34 for each thread.

A Second Embodiment: Zero-Time and Real-Time Phases of a Timestep

Turning next to FIGS. 8–13, a second embodiment of the distributed simulation system 10 in which a timestep includes at least two phases is shown. Each of the phases may be synchronized among the nodes in a manner similar to the above description. Additionally, exiting one of the phases (the last within the timestep) also results in exiting the timestep. Accordingly, the synchronization of timestep transitions may coincide with the synchronizing of one of the phase transitions.

In the embodiment described below, the NOP command is used by the DSNs to indicate that no communication is desired by the node. Accordingly, the NOP command may be an example of the local timestep complete command for the embodiment below. Similarly, the NOP command may be used as the "phase complete" command for phase synchronization. Two commands are defined to control the transition out of a phase (real time done, or RT_Done, and zero time done, or ZT_Done). One of these commands, e.g. RT_Done for an embodiment similar to FIG. 5, may also allow the transition from the current time step to the next timestep and thus may be an example of the global timestep complete command. An embodiment similar to FIG. 6 may include a separate command from the RT_Done and ZT_Done commands to indicate the end of the timestep, and such a command may be an example of a global timestep complete command.

The distributed simulation system 10 includes at least two phases within the simulation timestep: a zero time phase and a real time phase. During the zero time phase, DSNs, DCNs, and the hub may communicate with as many commands as desired (including commands which sample signals from the model or other facilities within the model and commands which change the values of the signals or the values in the facilities within the model) while the simulator is frozen. In other words, the DSNs do not cause the simulator to evaluate the model during the zero time phase (even if the received commands would otherwise cause scheduling of one or more events in the simulator). At the end of the zero time phase, any events scheduled as a result of activities in the zero time phase may be evaluated. As used herein, a facility of a model includes any internal structure or signal of the model which may be modified to cause an event within the model. A facility may also include a structure for monitoring a signal or state of the model.

The zero time phase may be used to allow test programs (e.g. test program 52) to transmit multiple commands to the various DSNs and receive replies to those commands without the simulation progressing between the commands. Thus, for example, a first command may be sent to a DSN to read a first facility or signal value. Based on the returned value, the test program may send another command to read a second facility or signal value. Since the simulator is frozen, the state of the second facility or signal value is the same as it was when the first signal or facility value was read (and vice versa). Accordingly, for example, a DCN may assemble state information from multiple DSNs (or from a single DSN) using multiple commands and may be assured that the state returned for each command is consistent with the other state returned for the other commands (since the state of the simulation is frozen).

The real time phase includes the sampling and driving of signals from the model and may also include time in which the model is evaluating (e.g. in response to driving input signals in the drive phase). The real time phase may further include evaluation of one or more commands received by the node (e.g. reading or writing model facilities relative to the current real time state). The sample and drive of signals (and a subsequent evaluation of the model) may be iterated multiple times within a timestep. The sampling of signals includes reading the signal values from the model and transmitting one or more transmit commands with the sampled signal values. The driving of signals includes receiving one or more transmit commands with the driven signal values and applying those signal values to the model. The subsequent evaluation of the model determines if the driven signal values cause any changes to signal values within the current timestep (e.g. if the driven signal asynchronously changes an output signal) and may also schedule events for subsequent timestep(s) based on the driven signal values. If any output signals have changed, another phase of sampling and driving may occur. The sampling and driving may be repeated until each DSN does not detect any changes to its output signals in the current timestep, at which time the current timestep may terminate and the next timestep may begin. By iteratively sampling, driving, and evaluating the model, asynchronous signals may be handled within the timestep (if the asynchronous output changes during the timestep).

The iteration of sampling, driving, and model evaluation may also be used for bi-directional signals (along with the bidi drivers 48 shown in FIG. 5). In the first iteration within a first DSN, the value being driven on the bi-directional signal by the model 20 may be sampled (e.g. the value may be a binary one or zero, a "Z" to indicate high impedance, or an "X" to indicate indeterminate). The bidi drivers 48 may be disabled at the beginning of the time step to allow sampling of the value being driven by the model 20 (i.e. unaffected by the bidi drivers 48 driving a value on the bi-directional signal). The sampled value may be transmitted to other DSNs having the bi-directional signal. Additionally, the other DSNs may transmit the sampled values on the bi-directional signal to the first DSN. The first DSN may calculate the value to be driven by the bidi drivers 48 and provide the value to the bidi drivers 48. For example, if all the other DSNs provided a Z value, the bidi drivers 48 may drive a Z. If one or more other DSNs provided a binary one and none provided a binary zero, the bidi drivers 48 may drive a binary one. Similarly, if one or more other DSNs provided a binary zero and none provided a binary one, the bidi drivers 48 may drive a binary zero. If one or more other DSNs provided a binary one and one or more provided a binary zero, the bidi drivers 48 may drive an "X". The first DSN may enable the bidi drivers 48 to drive the value, and may schedule a callback to cause the sample/drive sequence to be iterated. In the next iteration, if the sample detects a difference on the bi-directional signal, the bi-directional signal may be carrying an "X" (if the model 20 is driving the opposite binary value of the bidi drivers 48). The "X" may be propagated to other nodes, and the next iteration of the sample/drive sequence may detect no change (allowing progression to the next time step).

In one embodiment, the sampling of signals may include sampling each of the output (and input/output) signals of the model. In another embodiment, the sampling of signals may be accomplished by having the simulator indicate which of the signals have changed value due to event evaluations, and sampling only the signals that have changed. For example, Verilog simulators may support a value change alert (VCA). The VCA may typically be used for monitoring certain signals of interest during a simulation. If a signal changes value and the VCA is set for that signal, the simulator may call a specified function. The distributed simulation system may use the VCA for each output (and input/output) signal to detect changes in the signals, and may sample only those signals which were indicated, via the VCA, as having changed state. Such a system may limit the sampling of signals to only those that have changed state. Still other embodiments may include a mode to select which of the above methods (sampling all signals or sampling only those for which the VCA has indicated a change) is used.

While the embodiments described below include both a zero time phase and a real time phase, other embodiments are contemplated that include only the real time phase (which may include iteration to re-evaluate the model for changes to the input signals from the previous iteration). Additionally, embodiments are contemplated in which both the real time and zero time phases are iterated.

Turning now to FIG. 8, a timing diagram of one embodiment of a timestep is shown. Other embodiments are possible and contemplated. In the embodiment of FIG. 8, the timestep includes several model evaluations (labeled "logic" in FIG. 8 and referred to below as logic evaluations) at reference numerals 70, 72, and 74. Also, a first programming language interface (PLI) call is performed (reference numeral 76), which forms the zero time phase in this embodiment. A second PLI call is made to perform signal sampling and driving (reference numeral 78). The sampling and driving is included in the real time phase, along with the logic evaluations.

In one embodiment, the PLI interface may be compatible with IEEE 1364-1995 standard. Generally, the PLI interface may comprise a set of simulator-defined and/or user-defined functions called by the simulator 46 at certain predefined points within the timestep. The code comprising the functions may be part of the simulation control code 32.

At the beginning of the timestep, the simulator 46 may evaluate all the scheduled events occurring within the simulation timestep (logic 70). The simulator 46 may then call the PLI function or functions forming the zero time phase (reference numeral 76). In these functions, any zero time communication that is desired (e.g. testing various model signals/resources and modifying signals/resources) may be performed. The simulator 46 may then evaluate events which may have been scheduled due to zero time operations (if any) (logic 72). For example, the zero time operations may have modified a signal or register value, which results in evaluation events for each sensitive process. After evaluating any zero-time-generated events, the second PLI call (reference numeral 78) to sample output signals (including bi-directional signals) and to drive input signals (including bi-directional signals) is performed. The PLI function or functions may include the communication with the hub (and thus with other nodes) to transmit output signal values and receive input signal values. If new input signal values are driven, the PLI function may communicate to the simulator (e.g. scheduling a callback) that the PLI functions are to be called again after evaluating the events caused by the new input signal values. Repeating the sample/drive call is shown as the dotted arrow 80 in FIG. 8.

The sample/drive PLI function may schedule the callback each time new signal values are applied to the model. Thus, if an output signal changes within the current timestep (e.g. asynchronously), then the new value of the output signal may be transmitted within the current timestep. Similarly, if an input signal changes asynchronously, the new value of the input signal may be applied to the model during the current timestep (during the next iteration of the sample/drive PLI function). Once a sample/drive sequence occurs in which no input signal changes are applied and no output signal values change, the sample/drive PLI function may not schedule the callback and the timestep may end (moving to the next timestep). Similarly, the bi-directional signals may be resolved through iterating the sample/drive sequence (as described above).

The embodiment of FIG. 8 performs the zero time phase once per timestep and may iterate the real time phase. Other embodiments are contemplated in which the zero time phase may also be iterated. One such embodiment is shown in FIG. 9. In the embodiment of FIG. 9, the logic evaluations 70, 72, and 74 are included similar to FIG. 8. However, instead of having the zero time phase between the logic evaluations 70 and 72, a PLI call for Vera® test code is provided (reference numeral 82). This PLI call is optional and may be eliminated (along with the logic evaluation 72) in other embodiments. The call to the Vera® test code may typically be provided as shown in FIG. 9. Additionally, a PLI call used by the distributed simulation system (DSS) is provided (reference numeral 84). The PLI call 84 is shown in exploded view and may include both the real time phase sampling and driving the signals of the model (reference numeral 86) and the zero time phase for communicating similar to the reference numeral 76 in FIG. 8 (reference numeral 88). Subsequently, the logic evaluation 74 may occur and the optional callback may be performed (arrow 80) as discussed above. Since both the zero time and real time phases are included in the PLI call 84, both phases are iterated in the embodiment of FIG. 9.

While the embodiment of FIG. 9 illustrates the real time phase followed by the zero time phase within the PLI call 84, other embodiments may have the zero time phase precede the real time phase. Additionally, the iteration of zero time and real time phases may be separate in other embodiments (e.g. a timing diagram similar to FIG. 8 in which there is a callback from the logic evaluation 72 to the zero time PLI call 76).

It is noted that the IEEE 1364-1995 standard (and other standards related to Verilog) may be indeterminate with respect to the relationship between the evaluation of non-blocking assignment events and the PLI call, allowing the non-blocking assignment events to be evaluated either before or after the PLI call. If a simulator evaluating the non-blocking assignment events after the PLI call is used, some embodiments may force the scheduling of the PLI call after the non-blocking assignments have been assessed.

Turning next to FIGS. 10–13, flowcharts are shown illustrating operation of the DSN 30 (and more particularly the simulation control code 32, for the embodiment shown in FIG. 5) and the hub 60 (and more particularly the hub control code 62, for the embodiment shown in FIG. 7) during the zero time and real time phases of a timestep. The flowcharts refer to certain types of commands which may be defined by the grammar implemented by the distributed simulation system. In one embodiment, the grammar includes at least a real time done command (RT_Done) used by the hub to indicate to each of the DSNs/DCNs that the real time phase is complete for the current time step, a zero time done command (ZT_Done) used by the hub to indicate to each of the DSNs/DCNs that the zero time phase is complete for the current time step, a NOP command which indicates no-operation by the sender of the command, and a transmit command used to transmit signal values from one node to another. Any other commands may be included as desired. Specifically, a user command may be included (in which the command is followed by a string of characters used as a command to the receiving code, e.g. the simulation control code 32). The user command may be used in zero time to read and write model signals/facilities.

It is noted that the flowcharts of FIGS. 10–13 illustrate instruction code which is not a part of the simulator 46, in the present embodiment. The instruction code may be implemented as one or more callback functions in a callback table used by the simulator to call functions at various points during each timestep. In other embodiments, the instruction code illustrated in FIGS. 10–13 may be integrated as part of the simulator 46.

Figure 10:
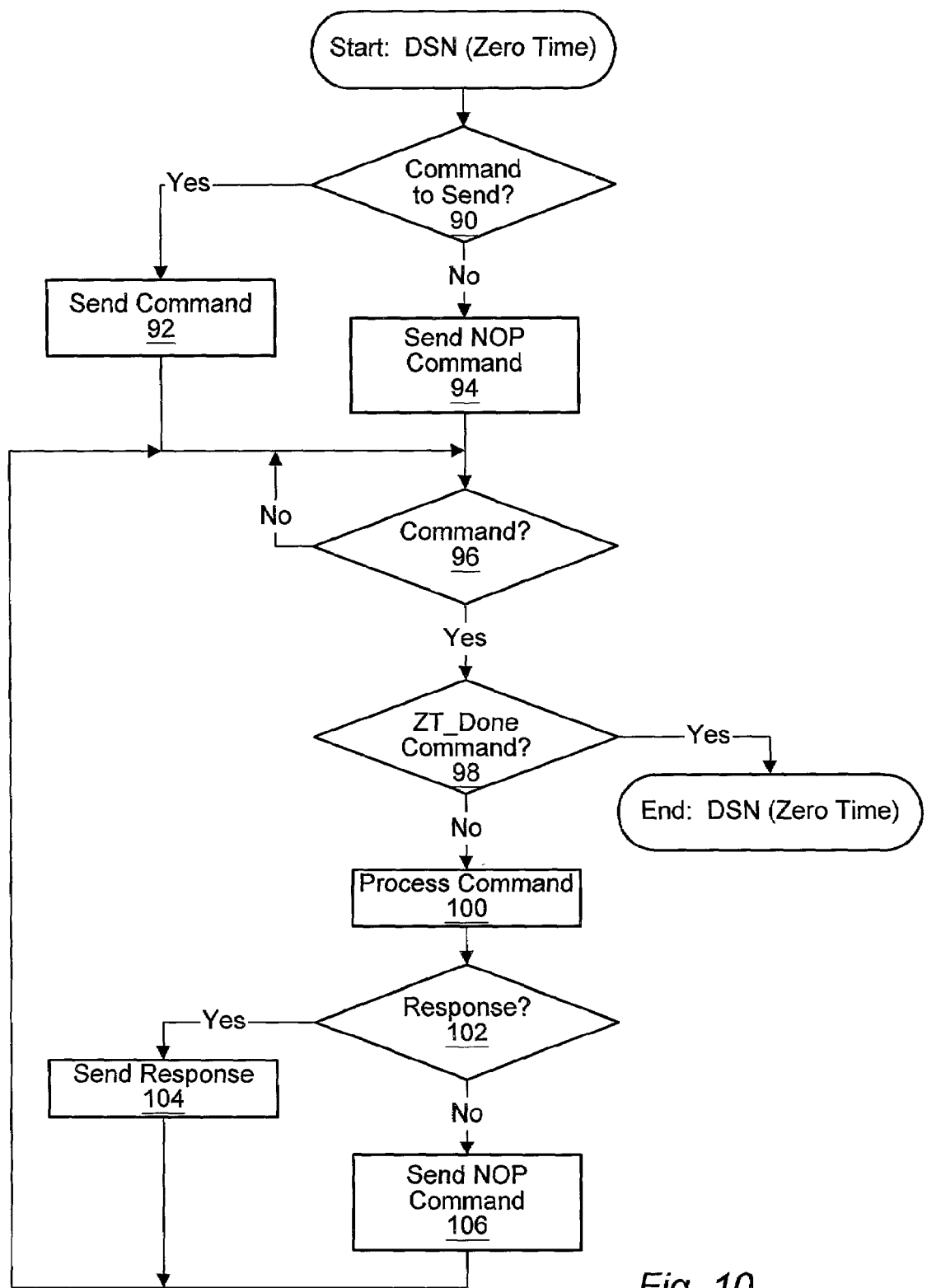
FIG. 10 is a flowchart illustrating operation of the second embodiment of the DSN during a zero time phase of a simulation timestep.

Turning now to FIG. 10, a flowchart is shown illustrating operation of one embodiment of the DSN 30 (and more particularly the simulation control code 32, for the embodiment of FIG. 5) during the zero time phase of a timestep. Other embodiments are possible and contemplated. While the blocks are shown in FIG. 10 in a particular order for ease of understanding, other orders may be used. Furthermore, blocks may be performed in parallel. The blocks shown in FIG. 10 may represent instruction code which, when executed, performs the blocks shown in FIG. 10. A DCN 50 may operate in a similar fashion.

The DSN 30 determines if it has a command to send (decision block 90). The DSN 30 may initially have a command to send if, for example, the DSN 30 includes test code which is designed to transmit commands (e.g. signal or facility values) to another node (e.g. a DCN). If the DSN 30 has a command to send, the DSN 30 sends the command to the hub 60 (block 92). If the DSN 30 does not have a command to send, the DSN 30 sends a NOP command to the hub 60 (block 94). As will be seen below, the hub 60 receives a command from each node before transmitting commands to the nodes in the present embodiment, and thus the NOP command is sent to provide a command from the DSN 30 to the hub 60.

The DSN 30 waits to receive a command (decision block 96). The waiting may be accomplished in a variety of fashions. For example, the decision block 96 may represent polling for a command, or may represent the DSN 30 being inactive ("asleep") until the command is received.

If the command is the zero time done (ZT_Done) command (decision block 98), then the zero time phase is complete for this timestep. The code may exit (e.g. return to the simulator 46).

If the command is not the zero time done (ZT_Done) command, the DSN 30 may process the command (block 100). For example, if the command requests signal or facility values, the DSN 30 may access the signal/facility to return the corresponding value. If the command supplies signal or facility values to be applied to the model, the DSN 30 may schedule an event to change the signal/facility value.

If the command requires a response (e.g. to supply the signal/facility values or to acknowledge the supplied signal/facility values—decision block 102), the DSN 30 transmits the response (block 104). Otherwise, the DSN 30 transmits the NOP command (block 106). In either case, the DSN 30 waits for another command (decision block 96).

Figure 11:
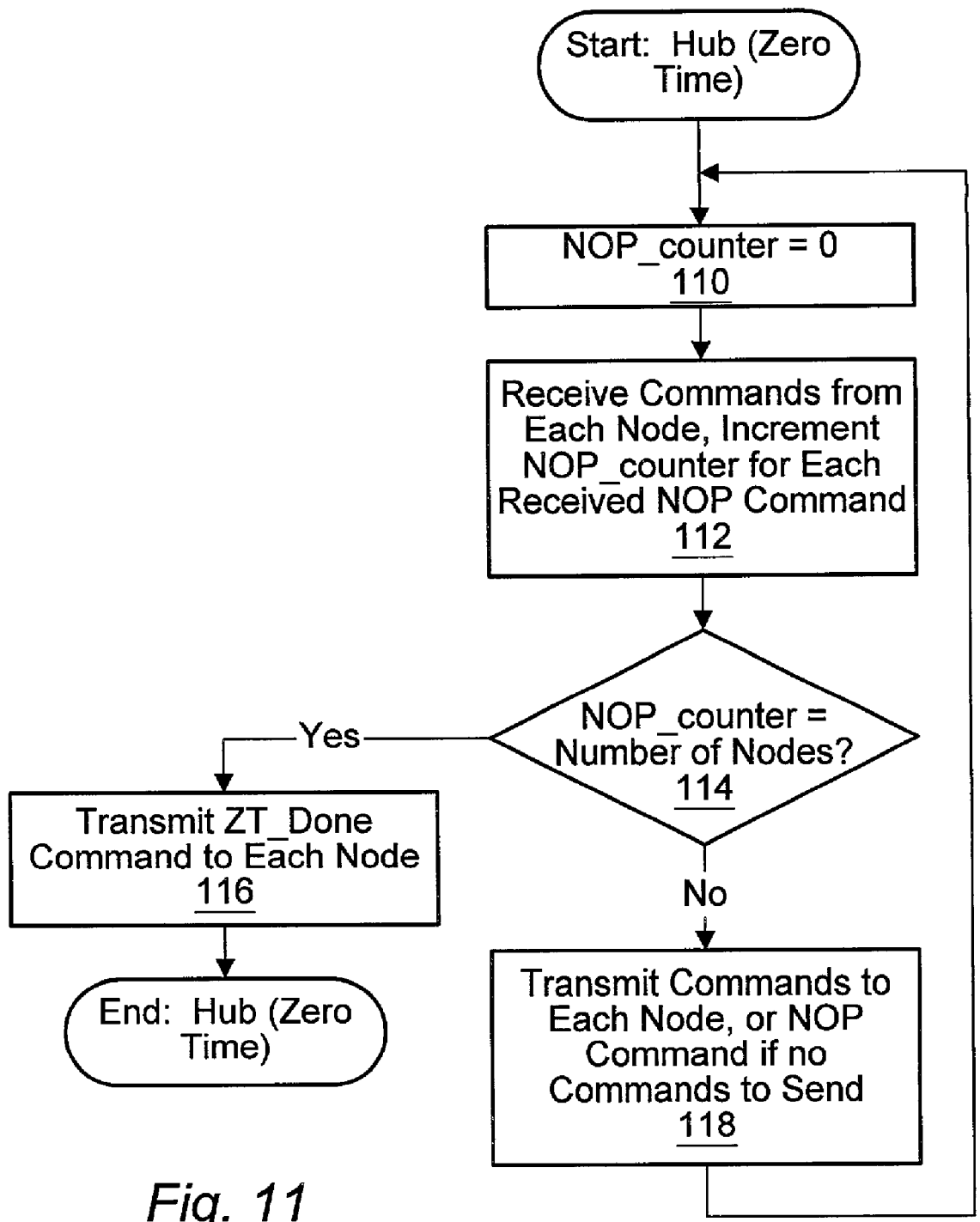
FIG. 11 is a flowchart illustrating operation of a second embodiment of the hub during a zero time phase of a simulation timestep.

Turning now to FIG. 11, a flowchart is shown illustrating operation of one embodiment of the hub 60 (and more particularly the hub control code 62, for the embodiment of FIG. 7) during the zero time phase of a timestep. Other embodiments are possible and contemplated. While the blocks are shown in FIG. 11 in a particular order for ease of understanding, other orders may be used. Furthermore, blocks may be performed in parallel. The blocks shown in FIG. 11 may represent instruction code which, when executed, performs the blocks shown in FIG. 11.

The hub 60 sets a NOP_counter variable to zero (block 110). The NOP_counter variable is used to count the number of NOP commands which are received by the hub 60. The hub then waits to receive a command from each node (block 112). Since each node sends one command and then waits for a command from the hub in the present embodiment, the hub may increment a counter for each received command and determine that each node has sent a command when the counter reaches the number of nodes in the distributed simulation system. Alternatively, the counter may be initialized to the number of nodes and decremented for each received command, and the counter reaching zero indicates that a command has been received from each node. The hub processes each received command, and may generate one or more commands for transmission to other nodes. For example, if a transmit command with signal values is received, the hub may generate transmit commands for each node which receives one or more of the signal values. If the command is the NOP command, the hub increments the NOP_counter.

Once a command has been received from each node, the hub checks the NOP_counter to see if the number of NOP commands received is equal to the number of DSN/DCN nodes in the distributed simulation system (decision block 114). If the number of NOP commands is equal to the number of DSN/DCN nodes, then the nodes have completed their zero time communication for this time step. Accordingly, the hub transmits the ZT_Done command to each of the nodes (block 116). The hub then exits the zero time phase (and, in the present embodiment, enters the real time phase illustrated in FIG. 13).

If at least one node did not send the NOP command, the hub sends a command to each DSN/DCN node (block 118). The command may be a transmit command including signal values transmitted by one or more other nodes. If signal values were received from two or more other nodes, the transmit command may include signal values gathered together by the hub 60. The command may be another command routed from one node to another. If there are no commands to route to a given DSN/DCN, the hub transmits the NOP command to the given DSN/DCN. The hub then returns to reset the NOP_counter to zero and waits for commands from each node.

Generally, the embodiment of the hub 60 shown in FIG. 11 uses a synchronous method of determining when the zero time phase is complete. In the illustrated mechanism, the hub receives one command from each DSN/DCN prior to transmitting commands to each DSN/DCN. As illustrated in FIG. 10, a DSN sends either some type of command to be sent to another node, or a NOP command if no other command is to be sent. Thus, if each received command is a NOP command, zero time is complete (indicated by sending a ZT_Done command from the hub to each DSN/DCN). Otherwise, the hub transmits at least one command to each DSN/DCN (either a command routed from another node or a NOP command) and the hub then waits for commands. Other embodiments may transmit any fixed number of commands per node, or may allow a variable number of commands per node to be transmitted. Still further, a fully asynchronous communication mechanism may be used (with DSNs/DCNs sending commands as desired, and the hub forwarding the packets as received, until each DSN/DCN indicates that it is finished sending commands (e.g. with a predefined ZT_Finish command), at which time the hub may transmit a ZT_Done command to each node to signify the end of the zero time phase).

Figure 12:
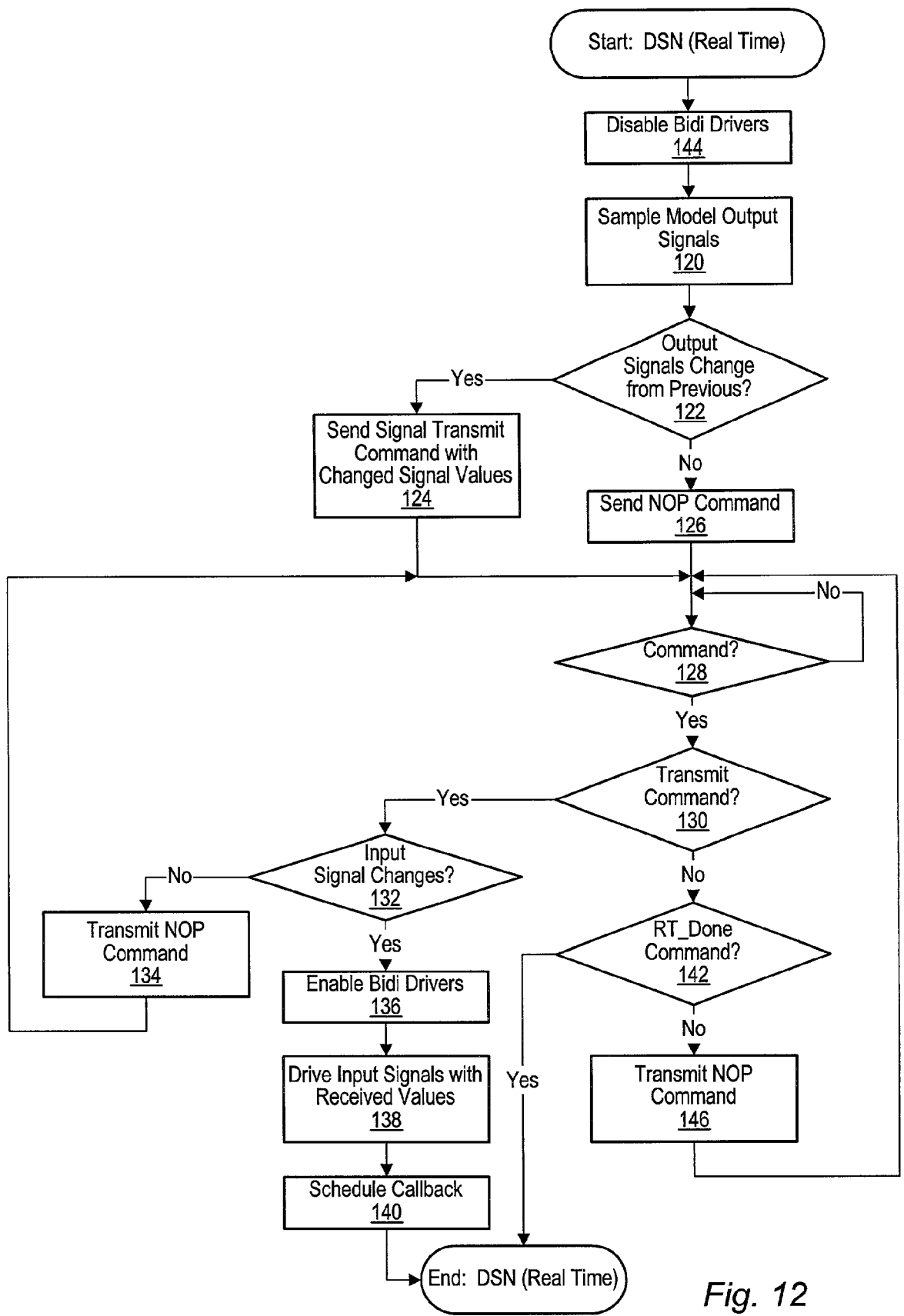
FIG. 12 is a flowchart illustrating operation of the second embodiment of the DSN during a real time phase of a simulation timestep.

Turning next to FIG. 12, a flowchart is shown illustrating operation of one embodiment of the DSN 30 (and more particularly the simulation control code 32, for the embodiment of FIG. 7) during the real time phase of a timestep. Other embodiments are possible and contemplated. While the blocks are shown in FIG. 12 in a particular order for ease of understanding, other orders may be used. Furthermore, blocks may be performed in parallel. The blocks shown in FIG. 12 may represent instruction code which, when executed, performs the blocks shown in FIG. 12.

The DSN 30 may disable the bidi drivers 48 (so that the sample in block 120 may result in sampling the value being driven by the model 20, without any effect by the bidi drivers 48) (block 144).

The DSN samples the model output signals (block 120). Generally, the sampling of the output signals may include interfacing to the model 20 (either directly or through the simulator 46) to retrieve the output signal values. In one embodiment, the simulator 46 may support certain function calls from the PLI for retrieving signal values. The list of output signals (including bi-directional signals) may be extracted from the model as part of initializing the simulation, and the list may be used to extract the signal values.

The DSN 30 compares the sampled output signal values to previously sampled output signal values to detect if any output signal values have changed from the previous sample (decision block 122). If one or more output signal values have changed, the DSN 30 transmits a transmit command with the changed signal values (block 124). Otherwise, the DSN 30 transmits a NOP command (block 126).

The DSN 30 waits to receive a command (decision block 128). The waiting may be accomplished in a variety of fashions. For example, the decision block 128 may represent polling for a command, or may represent the DSN 30 being inactive ("asleep") until the command is received.

If the received command is a transmit command (decision block 130), the DSN 30 examines the input signals and values provided in the transmit command to determine if any input signals to the model 20 have changed from previously driven values (decision block 132). If no changes are detected, the DSN 30 may transmit a NOP command and wait for additional commands to be sent. In this manner, evaluating the model and iterating the sample/drive sequence may be avoided in cases in which the signal values are not changed (and thus the evaluation of the model would result in no output signal changes). The DSN 30 waits for additional commands since, if a transmit command has been received, another node may be evaluating its model and may transmit an updated signal value for one or more input signals of the model 20. It is noted that, in some embodiments, checking for input signal changes may not be performed (e.g. the model may be evaluated and the sample/drive sequence may be iterated in response to receiving transmit commands which include no input signal changes for the model 20).

If the transmit command does include one or more input signal value changes, the DSN 30 may enable the bidi drivers 48 (to allow for any bi-directional signal changes to be driven onto the bi-directional signals) (block 136). The DSN 30 may further supply the input signal values to the simulator 46 for driving on the input signals (or to the bidi drivers 48 for bi-directional signals) (block 138). The DSN 30 may also cause a callback flag or other indication to be set in the simulator 46, to cause the iteration of the sample/drive sequence (block 140). Block 140 may comprise a function call to the simulator to schedule the callback, for example. Generally, by scheduling the callback, the block 140 causes the sample/drive sequence shown in FIG. 12 to be iterated again after the simulator 46 evaluates any events which may be caused by the new input signal values provided in the transmit command. The code may then exit to allow the simulator 46 to evaluate the model.

If the command is not a transmit command, the DSN 30 determines if the command is the RT_Done command signaling the end of the real time phase of the timestep (decision block 142). If the command is the RT_Done command, the code may exit (to be called again at the PLI stage in the next timestep).

If the command is not the RT_Done command, the command may be a NOP. The DSN 30 may transmit a NOP command (block 146) and wait for another command.

Figure 13:
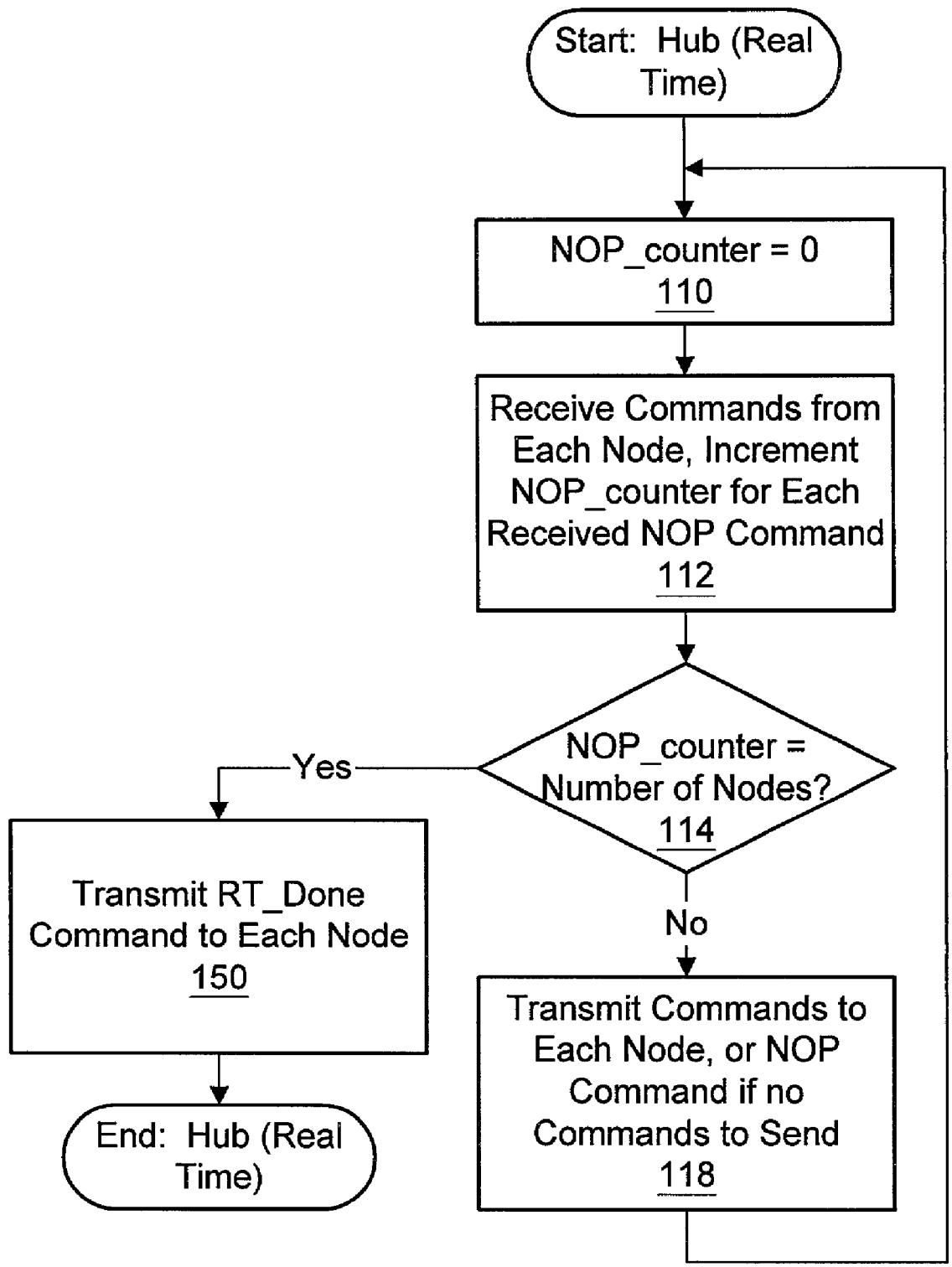
FIG. 13 is a flowchart illustrating operation of the second embodiment of the hub during a real time phase of a simulation timestep.

Turning next to FIG. 13, a flowchart is shown illustrating operation of one embodiment of the hub 60 (and more particularly the hub control code 62, for the embodiment of FIG. 7) during the real time phase of a timestep. Other embodiments are possible and contemplated. While the blocks are shown in FIG. 13 in a particular order for ease of understanding, other orders may be used. Furthermore, blocks may be performed in parallel. The blocks shown in FIG. 13 may represent instruction code which, when executed, performs the blocks shown in FIG. 13.

In the embodiment shown, the hub 60 may operate in a similar fashion in the real time phase as the hub operates in the zero time phase. That is, the hub 60 may receive commands from each DSN/DCN, count the NOP commands, compare the number of NOP commands to the number of DSN/DCN nodes, and transmit commands to the nodes if the number of received NOP commands is not equal to the number of DSN/DCN nodes (blocks 110, 112, 114, and 118). However, in this case, a real time done ($RT_{13}$ Done) command is transmitted instead of a ZT_Done command to each node when the number of NOP commands received equals the number of DSN/DCN nodes (block 150). The code sequence then exits (e.g. to the zero time code illustrated in FIG. 11, in this embodiment).

Similar to the description above for FIG. 11, other embodiments of the hub 60 may transmit any fixed number of commands per node, or may allow a variable number of commands per node to be transmitted. Still further, a fully asynchronous communication mechanism may be used (with DSNs/DCNs sending commands as desired, and the hub forwarding the packets as received, until each DSN/DCN indicates that it is finished sending commands (e.g. with a predefined finish command), at which time the hub may transmit an RT_Done command to each node to signify the end of the zero time phase).

It is noted that, in one embodiment, the distributed simulation system 10 may support the mapping of physical signals in the HDL models to user-defined logical signals, which may be arranged in user-defined logical ports. The routing of signals from node to node may be done on a logical port basis. Embodiments similar to the above embodiments may include the logical to physical mapping (or vice versa) where signal values are used.

Figure 14:
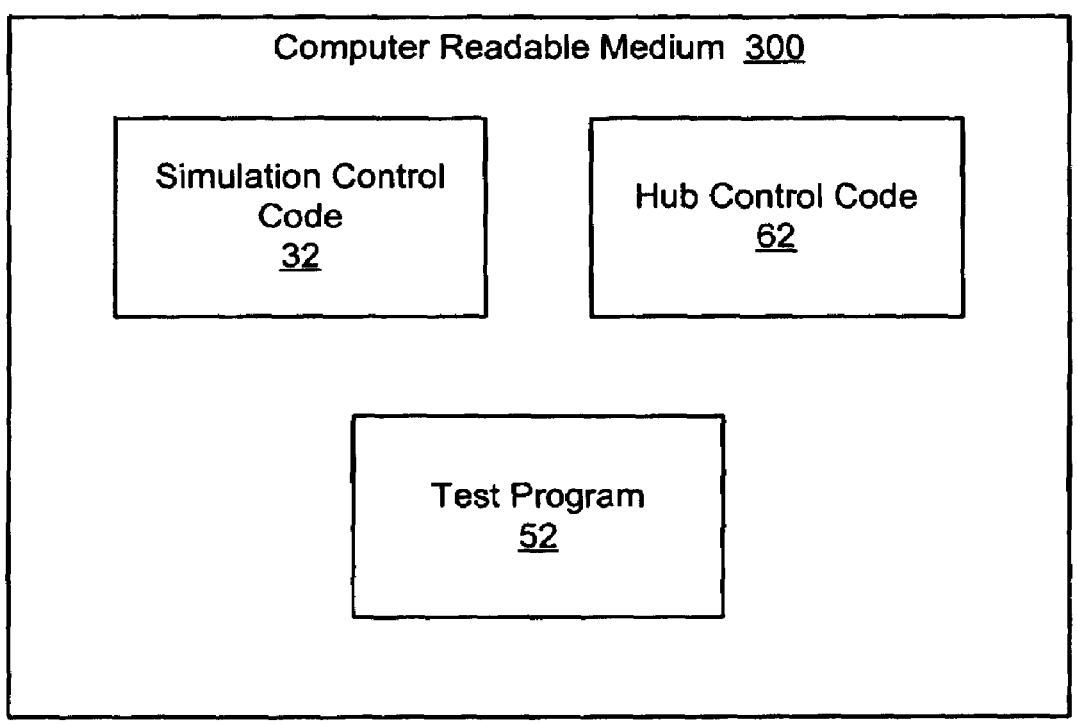
FIG. 14 is a block diagram of a carrier medium.

Turning next to FIG. 14, a block diagram of a carrier medium 300 is shown. Generally speaking, a carrier medium may include computer readable media such as storage media (which may include magnetic or optical media, e.g., disk or CD-ROM), volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

The carrier medium 300 is shown storing the simulation control code 32, the hub control code 62, and the test program 52. That is, the computer readable medium 300 is storing instruction sequences corresponding to the simulation control code 32, the hub control code 62, and the test program 52. Other embodiments may store only one of the simulation control code 32, the hub control code 62, and the test program 52. Still further, other code sequences may be stored (e.g. the simulator 46, the formatter 34, the parser 36, the sockets 38). Additionally, the model 20 and/or the bidi drivers 48 may be stored. The simulation control code 32 may represent embodiments implementing the flowchart of FIG. 3 or the flowcharts of FIGS. 10 and 12. The hub control code 62 may represent embodiments implementing the flowchart of FIG. 4 or the flowcharts of FIGS. 11 and 13.

The computer readable medium 300 as illustrated in FIG. 14 may represent multiple carrier media in multiple computer systems on which the distributed simulation system 10 executes. For example, the simulation control code 32 may be on a carrier medium in a first computer system on which a given DSN executes, and the hub control code 62 may be on a different carrier medium in a second computer system on which the hub executes.

Numerous variations and modifications will become apparent to those skilled in the art once the above disclosure is fully appreciated. It is intended that the following claims be interpreted to embrace all such variations and modifications.

What is claimed is:

1. A distributed simulation system comprising:
a plurality of nodes, wherein each node of the plurality of nodes comprises a simulator and is configured to simulate a different component of a system under test using the simulator, and wherein each node is configured to perform a simulation as a series of timesteps, wherein a timestep is a granule of simulation time by which the simulator evaluates events and advances the simulation of the component, and wherein a simulation of the system under test comprises the plurality of nodes simulating the components, and wherein each node is configured to transmit a first command indicating that the node has completed simulation for a first timestep and thus that the node is capable of completing the first timestep;
wherein a synchronized transition from the first timestep to a second timestep that follows the first timestep in the plurality of nodes is performed responsive to receiving the first command from each node of the plurality of nodes.

2. The distributed simulation system as recited in claim 1 further comprising a hub coupled to the plurality of nodes, wherein the hub is configured to synchronize the transition by transmitting a second command to each of the plurality of nodes.

3. The distributed simulation system as recited in claim 1 wherein the first command is a no-operation command.

4. The distributed simulation system as recited in claim 1 wherein the hub is configured to transmit a second command to each node of the plurality of nodes in response to receiving the first command from all nodes, and wherein each node is configured to transition to the next timestep in response to the second command, whereby the transition is synchronized.

5. The distributed simulation system as recited in claim 4 wherein the second command is a predefined command transmitted to each node.

6. The distributed simulation system as recited in claim 4 wherein the hub is configured, if at least one command which is not the first command is received from the plurality of nodes, to transmit commands other than the second command to each node.

7. The distributed simulation system as recited in claim 6 wherein each node of the plurality of nodes is configured to iterate evaluating events within the first timestep in response to receiving a command other than the second command.

8. The distributed simulation system as recited in claim 1 wherein each timestep comprises at least a first phase and a second phase, and wherein a transition between each phase is synchronized in the plurality of nodes.

9. A method comprising:
evaluating events within a first timestep in a plurality of nodes, each of the plurality of nodes simulating a different component of a system under test and configured to perform a simulation as a series of timesteps in a simulator, wherein a timestep is a granule of simulation time by which the simulator advances the simulation of the component, and wherein a simulation of the system under test comprises the plurality of nodes simulating the components;
each node of the plurality of nodes transmitting a first command indicating that the node has completed simulation for a first timestep and thus that the node is capable of completing the first timestep; and synchronizing a transition in the plurality of nodes from the first timestep to a second timestep responsive to receiving the first command from each node of the plurality of nodes.

10. The method as recited in claim 9 wherein the synchronizing comprises:
transmitting a second command to each node of the plurality of nodes in response to receiving the first command from each node, wherein each of the plurality of nodes is configured to transition to the second timestep in response to the second command.

11. The method as recited in claim 10 wherein the first command is a no-operation command.

12. The method as recited in claim 10 wherein the second command is a predefined command transmitted to each of the plurality of nodes.

13. The method as recited in claim 10 further comprising, in response to receiving at least one command which is not the first command from one of the plurality of nodes, transmitting commands other than the second command to each of the plurality of nodes.

14. The method as recited in claim 13 further comprising iterating the evaluating in at least one of the plurality of nodes in response to receiving a commands other than the second command.

15. The method as recited in claim 9 wherein the first timestep includes at least a first phase and a second phase, wherein the synchronizing comprises synchronizing a transition between the first phase and the second phase.

16. A computer readable medium comprising instructions which are executable to:
receive a first command from each of a plurality of nodes, each of the plurality of nodes comprising a simulator and simulating a different component of a system under test using the simulator, wherein each of the plurality of nodes is configured to perform a simulation as a series of timesteps, wherein a timestep is a granule of simulation time by which the simulator advances the simulation of the component, and wherein a simulation of the system under test comprises the plurality of nodes simulating the components; and
synchronize a transition in the plurality of nodes from a first timestep to a second timestep in response to receiving the first command from each of the plurality of nodes.

17. The computer readable medium as recited in claim 16 wherein the instructions are executable to synchronize the transition by transmitting a second command to each of the plurality of nodes.

18. The computer readable medium as recited in claim 17 wherein the instructions are executable to transmit commands other the second command if at least one command other than the first command is received from the plurality of nodes.

19. A computer readable medium comprising instructions executable to:
transmit a first command to a hub if a node that is simulating a component of a system under test is ready to transition from a first timestep to a second timestep in a simulator, wherein a timestep is a granule of simulation time by which the simulator advances the simulation of the component, and wherein a simulation of the system under test comprises the plurality of nodes simulating the components; and
transition to the second timestep in response to receiving a second command from the hub.

20. The computer readable medium as recited in claim 19 wherein the instructions are further executable to evaluate a plurality of events within the first timestep prior to transmitting the first command.

21. The computer readable medium as recited in claim 20 wherein the instructions are further executable to iterate evaluating events within the first timestep subsequent to transmitting the first command if a command other than the second command is received from the hub.

* * * * *